US010623025B2

(12) United States Patent
Lee et al.

(10) Patent No.: US 10,623,025 B2
(45) Date of Patent: *Apr. 14, 2020

(54) OPERATING METHOD OF MEMORY SYSTEM
(71) Applicant: SK hynix Inc., Gyeonggi-do (KR)
(72) Inventors: Hyung-Min Lee, Gyeonggi-do (KR); Jae-Yoon Lee, Gyeonggi-do (KR); Myeong-Woon Jeon, Gyeonggi-do (KR)
(73) Assignee: SK hynix Inc., Gyeonggi-do (KR)
(*) Notice: Subject to any disclaimer, the term of this patent is extended or adjusted under 35 U.S.C. 154(b) by 0 days.

This patent is subject to a terminal disclaimer.

(21) Appl. No.: 15/914,638
(22) Filed: Mar. 7, 2018
(65) Prior Publication Data
US 2018/0198470 A1 Jul. 12, 2018

Related U.S. Application Data

(63) Continuation of application No. 15/160,702, filed on May 20, 2016, now Pat. No. 9,948,323.

(30) Foreign Application Priority Data

Dec. 22, 2015 (KR) .................. 10-2015-0183647

(51) Int. Cl.
| H03M 13/00 | (2006.01) |
| H03M 13/29 | (2006.01) |
| G06F 11/10 | (2006.01) |
| G11C 16/10 | (2006.01) |
| G11C 16/26 | (2006.01) |
| G11C 29/52 | (2006.01) |

(Continued)

(52) U.S. Cl.
CPC ......... *H03M 13/29* (2013.01); *G06F 11/1012* (2013.01); *G06F 11/1068* (2013.01);
(Continued)

(58) Field of Classification Search
CPC ............. H03M 13/29; H03M 13/2909; H03M 13/2948; H03M 13/293; H03M 13/2927;
(Continued)

(56) References Cited

U.S. PATENT DOCUMENTS

| 8,861,272 B1* | 10/2014 | Horn .................. G11C 29/42 365/185.03 |
| 2009/0310876 A1* | 12/2009 | Nishi .................. H04N 5/145 382/236 |

(Continued)

FOREIGN PATENT DOCUMENTS

TW      201435887      9/2014

OTHER PUBLICATIONS

Office Action issued by the Taiwanese Intellectual Property Office dated Aug. 14, 2019.

*Primary Examiner* — Albert Decady
*Assistant Examiner* — Osman M Alshack
(74) *Attorney, Agent, or Firm* — IP & T Group LLP

(57) ABSTRACT

An operating method of a memory system includes: reading a first data from a particular data group among a plurality of data groups included in a memory device; performing a first error correction code (ECC) decoding for the first data; when the first ECC decoding fails, reading a plurality of the remaining data other than the first data from the particular data group; performing a second ECC decoding for the plurality of the remaining data; when the second ECC decoding fails, identifying data, to which the second ECC decoding fails, among the plurality of the remaining data; obtaining first and second soft read values respectively corresponding to the first data, to which the first ECC decoding fails, and the second data, to which the second ECC decoding fails; determining reliability of the first and second data based on the first and second soft read values; and correcting the first data based on the reliability of the first and second data.

21 Claims, 19 Drawing Sheets

(51) Int. Cl.
*H03M 13/15* (2006.01)
*H03M 13/23* (2006.01)

(52) U.S. Cl.
CPC .............. *G11C 16/10* (2013.01); *G11C 16/26* (2013.01); *G11C 29/52* (2013.01); *H03M 13/293* (2013.01); *H03M 13/2906* (2013.01); *H03M 13/2909* (2013.01); *H03M 13/2927* (2013.01); *H03M 13/2948* (2013.01); *H03M 13/152* (2013.01); *H03M 13/1515* (2013.01); *H03M 13/23* (2013.01); *H03M 13/2957* (2013.01)

(58) Field of Classification Search
CPC ......... H03M 13/2906; H03M 13/1515; H03M 13/152; H03M 13/2957; H03M 13/23; G06F 11/1012; G06F 11/1068; G11C 16/10; G11C 16/26; G11C 29/52
USPC ................ 714/721, 752, 755, 758, 763, 780
See application file for complete search history.

(56) References Cited

U.S. PATENT DOCUMENTS

| | | | |
|---|---|---|---|
| 2010/0077279 A1* | 3/2010 | Kim | G06F 11/1068 714/755 |
| 2011/0161774 A1* | 6/2011 | Shin | G06F 11/1012 714/755 |
| 2011/0252289 A1* | 10/2011 | Patapoutian | G06F 11/1048 714/763 |
| 2012/0224421 A1* | 9/2012 | Litsyn | G11C 16/08 365/185.03 |
| 2013/0173985 A1* | 7/2013 | Chung | H03M 13/1111 714/755 |
| 2013/0238955 A1* | 9/2013 | D'Abreu | G06F 11/1048 714/763 |
| 2013/0326314 A1* | 12/2013 | Choi | H03M 13/3784 714/780 |
| 2014/0129896 A1* | 5/2014 | Parthasarathy | H03M 13/1108 714/755 |
| 2014/0185377 A1* | 7/2014 | Kim | G11C 16/26 365/185.03 |

\* cited by examiner

FIG. 3

| | Index 0 | Index 1 | Index 2 | Index 3 | Index 4 | Index 5 | Index 6 | Index 7 | Index 8 | Index 9 | Index 10 | Index 11 | Index 12 | Index 13 | Index 14 | Index 15 |
|---|---|---|---|---|---|---|---|---|---|---|---|---|---|---|---|---|
| DATA_1 | 1 | 0 | 1 | 0 | 1 | 0 | 1 | 0 | 1 | 0 | 1 | 0 | 1 | 0 | 1 | 0 |
| DATA_2 | 0 | 1 | 1 | 1 | 1 | 1 | 1 | 1 | 0 | 1 | 0 | 1 | 1 | 0 | 1 | 0 |
| DATA_3 | 1 | 1 | 1 | 0 | 1 | 1 | 0 | 0 | 1 | 0 | 1 | 0 | 0 | 1 | 1 | 1 |
| DATA_4 | 1 | 0 | 0 | 0 | 0 | 0 | 0 | 1 | 0 | 1 | 1 | 1 | 1 | 0 | 1 | 0 |
| DATA_SPARE | 1 | 1 | 1 | 1 | 1 | 1 | 1 | 0 | 1 | 1 | 0 | 0 | 0 | 1 | 0 | 1 |

DATA GROUP_1, DATA GROUP_2, DATA GROUP_3

FIG. 6

| | Index 0 | Index 1 | Index 2 | Index 3 | Index 4 | Index 5 | Index 6 | Index 7 | Index 8 | Index 9 | Index 10 | Index 11 | Index 12 | Index 13 | Index 14 | Index 15 |
|---|---|---|---|---|---|---|---|---|---|---|---|---|---|---|---|---|
| 1st SOFT READ VALUE | ① | 1 | 1 | 1 | 1 | ⓪ | 1 | 0 | 1 | 1 | 1 | ⓪ | 0 | 1 | 0 | 0 |
| 2nd SOFT READ VALUE | 1 | 0 | 0 | 1 | 0 | ① | 0 | 1 | 1 | 0 | 1 | ⓪ | 0 | 1 | 0 | 1 |
| DATA_1 | 1 | 0 | 1 | 0 | 1 | 0 | 1 | 0 | 1 | 0 | 1 | 0 | 1 | 0 | 1 | 0 |
| DATA_2 | 0 | 1 | 1 | 1 | 1 | 0 | 1 | 0 | 1 | 0 | 0 | 1 | 1 | 0 | 1 | 0 |
| DATA_3 | 1 | 1 | 1 | 0 | 1 | 1 | 1 | 0 | 1 | 1 | 1 | 0 | 0 | 0 | 1 | 1 |
| DATA_n | 1 | 0 | 0 | 0 | 0 | 0 | 0 | 0 | 1 | 1 | 1 | 1 | 1 | 0 | 1 | 0 |
| DATA_SPARE | 1 | 0 | 1 | 1 | 0 | 0 | 1 | 0 | 0 | 1 | 1 | 0 | 1 | 1 | 0 | 1 |

▨ : Error

OPERATING METHOD OF MEMORY SYSTEM

CROSS-REFERENCE TO RELATED APPLICATIONS

This application is a continuation of U.S. patent application Ser. No. 15/160,702 filed on May 20, 2016, which claims priority of Korean Patent Application No. 10-2015-0183647, filed on Dec. 22, 2015. The disclosure of each of the foregoing applications is incorporated herein by reference in its entirety.

BACKGROUND

1. Field

Various embodiments of the present invention relate to a memory system and, more particularly, to an operating method of the memory system for correcting error data bits.

2. Description of the Related Art

A communication channel or simply a channel may be broadly defined to include a data storage apparatus which stores data and reads out the stored data. A channel also includes a path through which data are transferred. For example, data may be transferred from a host through a channel to a data storage apparatus for storing, or data read out from a data storage device may be transferred to a channel to the host. The channel may be a wireless path.

Data may be corrupted, that is one or more errors may occur in the data bits, during transfer through a channel. Heretofore, there has been extensive research on apparatuses and methods for detecting and correcting data errors for restoring corrupted data to the original data. For example, different types of error correction codes (ECC), also referred to as an error control codes, are used to detect and correct data errors for restoring corrupted data to the original data. Hence, for example, via error code encoding, corrupted read data can be restored.

The error rate of a particular channel depends on the specific characteristics of the channel. As channels become more complex and the speed of data transfer increases, data error rates also become greater. Hence, further improvements for error encoding and decoding methods and more sophisticated error correction devices are needed.

SUMMARY

Various embodiments of the present invention are directed to an operating method of a memory system for correcting data bit errors.

In accordance with an embodiment of the present invention, an operating method of a memory system may include: reading a first data from a particular data group among a plurality of data groups included in a memory device; performing a first error correction code (ECC) decoding for the first data; when the first ECC decoding fails, reading a plurality of the remaining data other than the first data from the particular data group; performing a second ECC decoding for the plurality of the remaining data; when the second ECC decoding fails, identifying data, to which the second ECC decoding fails, among the plurality of the remaining data; obtaining first and second soft read values respectively corresponding to the first data, to which the first ECC decoding fails, and the second data, to which the second ECC decoding fails; determining reliability of the first and second data based on the first and second soft read values; and correcting the first data based on the reliability of the first and second data.

The plurality of data groups include data groups may include: a plurality of data; and a spare data obtained through an XOR operation to the plurality of data. The obtaining the first and second soft read values includes obtaining first and second re-read data by reading again the first data through a first read voltage and a second read voltage different from the first read voltage and obtaining the first soft read voltage corresponding to the first data by performing a XOR operation for the first and second re-read data and inverting one or more resultant bits of the XOR operation for the first and second re-read data. The obtaining the first and second soft read values includes obtaining third and fourth re-read data by reading again the second data through a third read voltage and a fourth read voltage different from the third read voltage and obtaining the second soft read voltage corresponding to the second data by performing a XOR operation for the third and fourth re-read data and inverting one or more resultant bits of the XOR operation for the third and fourth re-read data. The correcting of the error bit of the first data includes determining whether or not to determine the reliability of the bit of the second data according to the determination result of the reliability of the bit of the first data through the first soft read value. The determining of whether or not to determine the reliability of the bit of the second data through the first and second soft read values may include when the bit of the first data is determined to be of high reliability, determining whether the bit of the first bit is the last bit without determining the reliability of the bit of the second data, when the bit of the first bit is determined not to be the last bit, increasing index of bit of the first data and repeating the determining of the reliability of the bit of the first data through the first soft read value and when the bit of the first bit is determined to be the last bit, performing a third ECC decoding for the first data, in which the error bit is corrected. The determining of whether or not to determine the reliability of the bit of the second data through the first and second soft read values may include when the bit of the first data is determined to be of low reliability, determining the reliability of the bit of the second data through the second soft read value. The determining of the reliability of the bit of the second data through the second soft read value includes: when the bit of the second data is determined to be of high reliability, correcting the bit of the first data, which is of the low reliability, by performing a XOR operation for the plurality of the remaining data other than the first data in the particular data group. The determining of the reliability of the bit of the second data through the second soft read value may include: when the bit of the second data is determined to be of low reliability, determining whether the bit of the first bit is the last bit; when the bit of the first bit is determined not to be the last bit, increasing index of bit of the first data and repeating the determining of the reliability of the bit of the first data through the first soft read value; and when the bit of the first bit is determined to be the last bit, performing a third ECC decoding for the first data.

In accordance with an embodiment of the present invention, an operating method of a memory system may include: reading a first data from a particular data group among a plurality of data groups included in a memory device; performing a first error correction code (ECC) decoding for the first data; when the first ECC decoding fails, reading one or more second data, which is the remaining data other than the first data, from the particular data group and performing a second ECC decoding for the second data; when the second ECC decoding fails, obtaining a third data through the second data, to which the second ECC decoding is successful; obtaining first and second soft read values respectively corresponding to the first data, to which the first ECC decoding fails, and the second data, to which the second ECC decoding fails; determining whether the first data includes an error bit by determining reliability of the first data based on the first soft read value; when the first data includes an error bit, determining whether the second data includes an error bit by determining reliability of the second data based on the second soft read value; and when the second data does not include an error bit, correcting the first data based on the second data, to which the second ECC decoding fails, and the third data.

The plurality of data groups include data groups may include: a plurality of data; and a spare data obtained through an XOR operation to the plurality of data. When the second ECC decoding is successful, correcting the error bit of the first data by performing a XOR operation for the second data. The obtaining of the third data through the second data, to which the second ECC decoding is successful, when the second ECC decoding fails, may include: obtaining the third data by performing a XOR operation for the second data, to which the second ECC decoding is successful. The obtaining the first and second soft read values may include: obtaining first and second re-read data by reading again the first data through a first read voltage and a second read voltage different from the first read voltage; and obtaining the first soft read voltage corresponding to the first data by performing a XOR operation for the first and second re-read data and inverting one or more resultant bits of the XOR operation for the first and second re-read data. The obtaining the first and second soft read values includes: obtaining third and fourth re-read data by reading again the second data through a third read voltage and a fourth read voltage different from the third read voltage; and obtaining the second soft read voltage corresponding to the second data by performing a XOR operation for the third and fourth re-read data and inverting one or more resultant bits of the XOR operation for the third and fourth re-read data. The determining of whether each bit of the first data is an error bit by determining reliability of the bit of the first data through the first soft read value may include: determining the reliability of the bit of the first data through the first soft read value; when the bit of the first data is determined to be of low reliability, determining the bit of the first data to be the error bit; and when the bit of the first data is determined to be of high reliability, determining the bit of the first data not to be the error bit. The determining of the reliability of the bit of the second data through the second soft read value may be not performed when the bit of the first data is determined not to be the error bit as a result of the determining of the reliability of the bit of the first data through the first soft read value. The determining of whether each bit of the second data is an error bit by determining reliability of the bit of the second data through the second soft read value may include: determining the reliability of the bit of the second data through the second soft read value; when the bit of the second data is determined to be of low reliability, determining the bit of the second data to be the error bit; and when the bit of the second data is determined to be of high reliability, determining the bit of the second data not to be the error bit. The correcting of the error bit of the first data may include: correcting the error bit of the first data by performing a XOR operation for the bits of the second data, to which the second ECC decoding fails, and the third data. When the bit of the second data is the error bit, further may comprise: determining whether the bit of the first bit is the last bit; when the bit of the first bit is determined not to be the last bit, increasing index of bit of the first data and repeating the determining of the reliability of the bit of the first data through the first soft read value; and when the bit of the first bit is determined to be the last bit, performing a third ECC decoding for the first data.

In accordance with an embodiment of the present invention, an operating method of a memory system may include: reading a first data from a particular data group among a plurality of data groups included in a memory device; performing a first error correction code (ECC) decoding for the first data; when the first ECC decoding fails, reading a plurality of the remaining data other than the first data from the particular data group; performing a second ECC decoding for the plurality of the remaining data and determining whether the second ECC decoding is successful; when the second ECC decoding fails, obtaining a second data through the plurality of the remaining data, to which the second ECC decoding is successful; obtaining a plurality of soft read values respectively corresponding to the first data, to which the first ECC decoding fails, and the plurality of the remaining data, to which the second ECC decoding fails; obtaining a second soft read value through the other soft read values other than a first soft read value, which corresponds to the first data among the plurality of soft read values; obtaining a third data through the plurality of the remaining data, to which the second ECC decoding fails; determining whether the first data includes an error bit by determining reliability of the first data based on the first soft read value; when the first data includes an error bit, determining whether the third data includes an error bit by determining reliability of the third data based on the second soft read value; and when the third data does not include an error bit, correcting the first data based on the second data and the third data. The plurality of data groups include a plurality of data groups may include: a plurality of data; and a spare data obtained through an XOR operation to the plurality of data. The obtaining of the second data through the plurality of the remaining data, to which the second ECC decoding is successful, is performed by performing a XOR operation for a plurality of the remaining data, to which the second ECC decoding is successful among the plurality of the remaining data. The obtaining of the second soft read value through the other soft read values other than the first soft read value, which corresponds to the first data among the plurality of soft read values, is performed by performing an AND operation for the other soft read values other than the first soft read value, which corresponds to the first data among the plurality of soft read values. The determining of whether each bit of the first data is an error bit by determining reliability of the bit of the first data through the first soft read value may include: determining the reliability of the bit of the first data through the first soft read value; when the bit of the first data is determined to be of low reliability, determining the bit of the first data to be the error bit; and when the bit of the first data is determined to be of high reliability, determining the bit of the first data not to be the error bit. The determining of the reliability of the bit of the second data through the second soft read value is not performed when the bit of the first data is determined not to be the error bit as a result of the determining of the reliability of the bit of the first data through the first soft read value. When the bit of the first data is the error bit, the determining of whether each bit of the third data is an error bit by determining reliability of the bit of the third data through the second soft read value may include: determining the reliability of the bit of the third data through the second soft read value; when the bit of the third data is determined to be of low reliability, determining the bit of the third data to be the error bit; and when the bit of the third data is determined to be of high reliability, determining the bit of the third data not to be the error bit. The correcting of the error bit of the first data may include: correcting the error bit of the first data by performing a XOR operation for the bits of the second data and the third data. When the bit of the third data may be the error bit as a result of the determination of whether each bit of the third data is the error bit by determining the reliability of the bit of the third data, further may comprise: determining whether the bit of the first bit is the last bit; when the bit of the first bit is determined not to be the last bit, increasing index of bit of the first data and repeating the determining of the reliability of the bit of the first data through the first soft read value; and when the bit of the first bit is determined to be the last bit, performing a third ECC decoding for the first data.

In accordance with an embodiment of the present invention, a plurality of soft read values corresponding to the two or more data may be obtained, a soft read value corresponding to a read data that is read-requested by a host among the two or more data may be used, and an error bit of the read data may be corrected according to a determination result of the reliability of the bits of the read data.

In accordance with an embodiment of the present invention, a memory device that includes a plurality of memory dies each of which includes a plurality of planes, each of which includes a plurality of memory blocks that store data; and a controller including a ECC unit, and configured to: reading a first data from a particular data group among a plurality of data groups included in the memory device; performing a first error correction code (ECC) decoding for the first data; when the first ECC decoding fails, reading a plurality of the remaining data other than the first data from the particular data group; erforming a second ECC decoding for the plurality of the remaining data; when the second ECC decoding fails, identifying data, to which the second ECC decoding fails, among the plurality of the remaining data; obtaining first and second soft read values respectively corresponding to the first data, to which the first ECC decoding fails, and the second data, to which the second ECC decoding fails; determining reliability of the first and second data based on the first and second soft read values; and correcting the first data based on the reliability of the first and second data.

In accordance with an embodiment of the present invention, memory device that includes a plurality of memory dies each of which includes a plurality of planes, each of which includes a plurality of memory blocks that store data; and a controller including a ECC unit, and configured to: reading a first data from a particular data group among a plurality of data groups included in a memory device; performing a first error correction code (ECC) decoding for the first data;

when the first ECC decoding fails, reading one or more second data, which is the remaining data other than the first data, from the particular data group and performing a second ECC decoding for the second data; when the second ECC decoding fails, obtaining a third data through the second data, to which the second ECC decoding is successful; obtaining first and second soft read values respectively corresponding to the first data, to which the first ECC decoding fails, and the second data, to which the second ECC decoding fails; determining whether the first data includes an error bit by determining reliability of the first data based on the first soft read value; when the first data includes an error bit, determining whether the second data includes an error bit by determining reliability of the second data based on the second soft read value; and when the second data does not include an error bit, correcting the first data based on the second data, to which the second ECC decoding fails, and the third data.

In accordance with an embodiment of the present invention, a memory device that includes a plurality of memory dies each of which includes a plurality of planes, each of which includes a plurality of memory blocks that store data; and a controller including a ECC unit, and configured to: reading a first data from a particular data group among a plurality of data groups included in a memory device; performing a first error correction code (ECC) decoding for the first data; when the first ECC decoding fails, reading a plurality of the remaining data other than the first data from the particular data group; performing a second ECC decoding for the plurality of the remaining data and determining whether the second ECC decoding is successful; when the second ECC decoding fails, obtaining a second data through the plurality of the remaining data, to which the second ECC decoding is successful; obtaining a plurality of soft read values respectively corresponding to the first data, to which the first ECC decoding fails, and the plurality of the remaining data, to which the second ECC decoding fails; obtaining a second soft read value through the other soft read values other than a first soft read value, which corresponds to the first data among the plurality of soft read values; obtaining a third data through the plurality of the remaining data, to which the second ECC decoding fails; determining whether the first data includes an error bit by determining reliability of the first data based on the first soft read value; when the first data includes an error bit, determining whether the third data includes an error bit by determining reliability of the third data based on the second soft read value; and when the third data does not include an error bit, correcting the first data based on the second data and the third data.

BRIEF DESCRIPTION OF THE DRAWINGS

FIG. 3 is a diagram illustrating a plurality of data groups, in accordance with an embodiment of the present invention.

FIG. 6 is a diagram explaining an operation for determining data reliability based on soft read values, in accordance with a first embodiment of the present invention.

DETAILED DESCRIPTION

Figure 1:
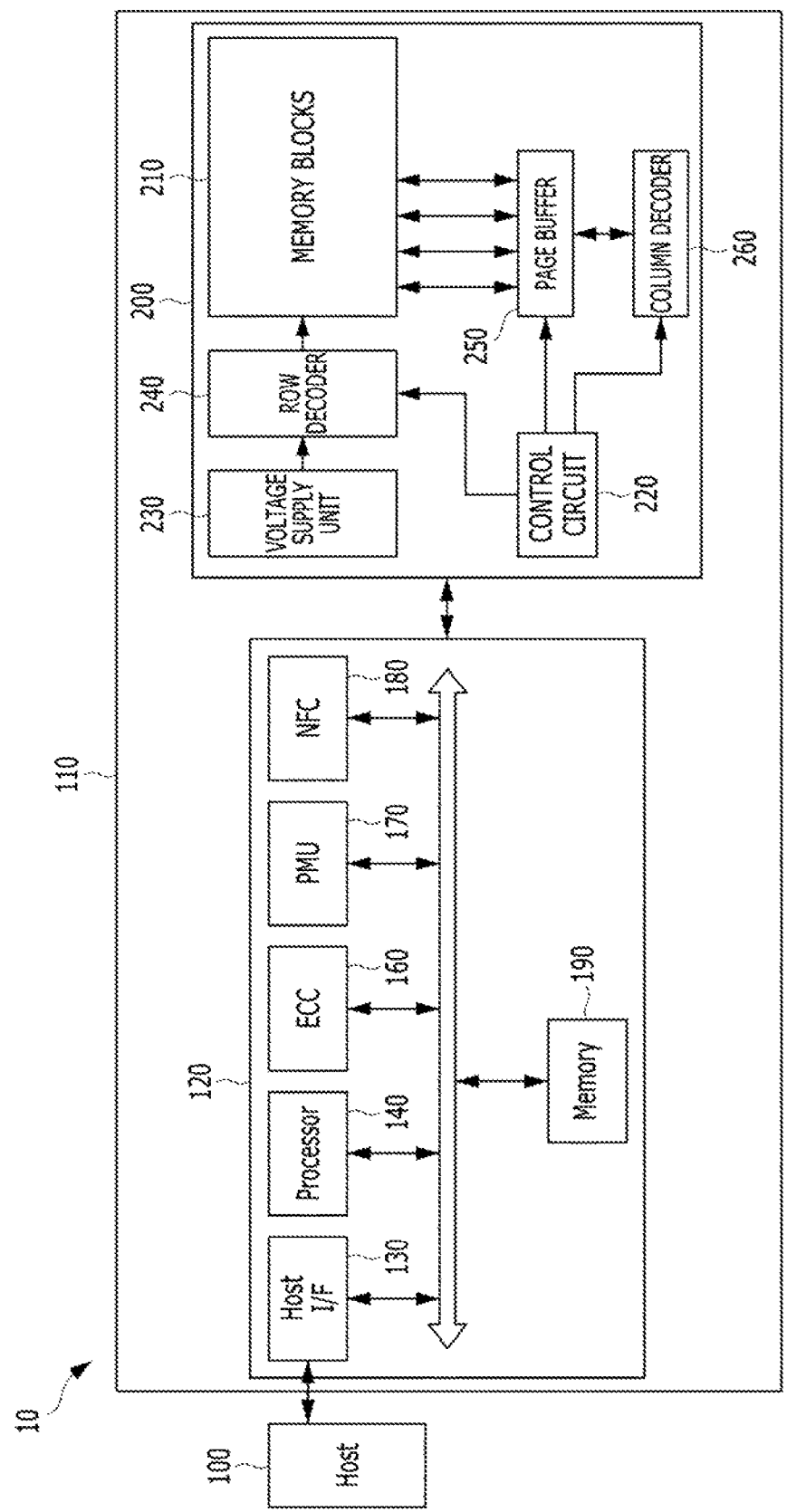
FIG. 1 is a block diagram illustrating a semiconductor memory system, in accordance with an embodiment of the present invention.

Various embodiments will now be described below in more detail with reference to the accompanying drawings. The present invention may, however, be embodied in different forms and should not be construed as being limited to the embodiments set forth herein. Rather, these embodiments are provided so that this disclosure will be thorough and complete and will fully convey the present invention to those skilled in the art.

The drawings are not necessarily to scale and in some instances, proportions may have been exaggerated in order to clearly illustrate features of the embodiments. Throughout the disclosure, reference numerals correspond directly to the like parts in the various figures and embodiments of the present invention.

It is also noted that in this specification, "connected/coupled" refers to one element not only directly coupling another element but also indirectly coupling another element through an intermediate element.

In addition, a singular form may include a plural form as long as it is not specifically mentioned otherwise. It should be readily understood that the meaning of "on" and "over" in the present disclosure should be interpreted in the broadest manner so that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to a case where the first layer is formed directly on the second layer or the substrate but also a case where a third layer exists between the first layer and the second layer or the substrate. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

In some instances, as would be apparent to one of ordinary skill in the art elements described in connection with a particular embodiment may be used singly or in combination with other embodiments unless specifically indicated otherwise.

Hereinafter, the various embodiments of the present invention will now be described in detail with reference to the attached drawings.

FIG. 1 is a block diagram illustrating a semiconductor memory system 110, in accordance with an embodiment of the present invention.

According to the embodiment of FIG. 1, a data processing system 10 may include a host 100 and the memory system 110.

The host 100 may include, for example, a portable electronic device such as a mobile phone, an MP3 player, and a laptop computer or an electronic device such as a desktop computer, a game player, a TV, a projector and the like.

The memory system 110 may operate in response to a request of the host 100 and, in particular, may store data to be accessed by the host 100. For example, the memory system 110 may be used as a main memory system or an auxiliary memory system of the host 100. The memory system 110 may be implemented with any one of various kinds of storage devices, according to the protocol of a host interface to be electrically coupled with the host 100. The memory system 110 may be implemented with any one of various kinds of storage devices, such as, for example, a solid-state drive (SSD), a multimedia card (MMC), an embedded MMC (eMMC), a reduced-size MMC (RS-MMC) and a micro-MMC, a secure digital (SD) card, a mini SD card, a micro SD card, a universal serial bus (USB) storage device, a universal flash storage (UFS) device, a compact flash (CF) card, a smart media (SM) card, a memory stick, and the like.

The storage device for the memory system 110 may be implemented with a volatile memory device, such as, for example, a dynamic random access memory (DRAM) and a static random access memory (SRAM) or a nonvolatile memory device, such as, for example, a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), a resistive RAM (RRAM), and the like. One or more storage devices may be used.

A memory system 110 may include a memory device 200 which may store data to be accessed by the host 100, and a controller 120 which may control storage of data in the memory device 200.

The controller 120 and the memory device 200 may be integrated into a semiconductor device and configured as a memory card. For instance, the controller 120 and the memory device 200 may be integrated into a semiconductor device and configured as a solid state drive (SSD). When the memory system 110 is used as the SSD, the operation speed of the host 100 that is electrically coupled with the memory system 110 may be significantly increased.

The controller 120 and the memory device 200 may be integrated into a semiconductor device and configured as a memory card. For example, the controller 120 and the memory device 200 may be integrated into a semiconductor device and configured as a memory card, such as, for example, a personal computer memory card international association (PCMCIA), a compact flash (CF) card, a smart media (SM) card (SMC), a memory stick, a multimedia card (MMC), a reduced-size (RS)MMC, a micro-MMC, a secure digital (SD) card, a mini-SD SD card, a micro-SD card, a secure digital high capacity (SDHC), a universal flash storage (UFS) device, and the like.

In an embodiment, the memory system 110 may be or include a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, one of various component elements configuring a computing system, and the like.

The memory device 200 of the memory system 110 may retain stored data even when power supply is interrupted. In particular, the memory device 200 may store the data provided from the host 100 through a write operation, and provide stored data to the host 100 through a read operation.

The memory device 200 of the memory system 110 may include a plurality of memory blocks 210, a control circuit 220, a voltage supply unit 230, a row decoder 240, a page buffer 250, and a column decoder 260. The memory device 200 may be a nonvolatile memory device, for example the flash memory device. The flash memory device may have a 3-dimensional (3D) stacked structure.

Each of the memory blocks 210 may include a plurality of pages. Each of the pages may include a plurality of memory cells to which a plurality of word lines (WL) are electrically coupled.

The control circuit 220 may control various operations of the memory device 200, such as, for example, program, erase, and read operations.

The voltage supply unit 230 may provide word lines voltages, such as, for example, a program voltage, a read voltage, and a pass voltage, to the respective word lines according to an operation mode, and may provide a voltage to be supplied to a bulk, for example, a well region, in which the memory cells are formed. A voltage generating operation of the voltage supply circuit 230 may be performed under control of the control logic 220. The voltage supply unit 230 may generate a plurality of variable read voltages for generation of a plurality of read data.

The row decoder 240 may select one of the memory blocks or sectors of the memory cell array 210, and may select one among the word lines of the selected memory block under the control of the control logic 220. The row decoder 240 may provide the word line voltage generated from the voltage supply circuit 230 to selected word lines or non-selected word lines under the control of the control logic 220.

During a program operation, the page buffer 250 may operate as a write driver for driving the bit lines according to data to be stored in the memory block 210. During the program operation, the page buffer 250 may receive the data to be written in the memory block 210 from a buffer (not illustrated), and may drive the bit lines according to the input data. The page buffer 250 may be formed of a plurality of page buffers (PB) 251 corresponding to the columns or the bit lines, or column pairs or bit line pairs, respectively. A plurality of latches may be included in each of the plurality of page buffers 251.

The controller 120 of the memory system 110 may control the memory device 200 in response to a request from the host 100. The controller 120 may provide the data read from the memory device 200, to the host 100, and store the data from the host 100 into the memory device 200. To this end, the controller 120 may control the overall operations of the memory device 200, such as, for example, read, write, program and erase operations.

The controller 120 may include a host interface unit 130, a processor 140, an error correction code (ECC) unit 160, a power management unit (PMU) 170, a NAND flash controller (NFC) 180, and a memory 190.

The host interface 130 may process a command and data from the host 100 and may communicate with the host 100 through at least one of various interface protocols, such as, for example, a universal serial bus (USB), a multi-media card (MMC), a peripheral component interconnect express (PCI-E), a serial-attached SCSI (SAS), a serial advanced technology attachment (SATA), a parallel advanced technology attachment (PATA), a small computer system interface (SCSI), an enhanced small disk interface (ESDI), an integrated drive electronics (IDE), and the like.

The ECC unit 160 may detect and correct errors in data read from the memory device 200 during the read operation. The ECC unit 160 may perform the ECC decoding on the data read from the memory device 200, determine whether the ECC decoding succeeds, output an instruction signal according to the determination result, and correct error bits of the read data using parity bits generated during the ECC encoding. The ECC unit 160 may not correct error bits when the number of the error bits is greater than or equal to a threshold number of correctable error bits, and may output an error correction fail signal indicating failure in correcting the error bits.

The ECC unit 160 may perform an error correction operation based on a coded modulation, such as, for example, a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a block coded modulation (BCM), and the like. The ECC unit 160 may include all circuits, systems or devices needed for the error correction operation.

The PMU 170 may provide and manage power for the controller 120, for example, power for the component elements included in the controller 120.

The NFC 180 may serve as a memory interface between the controller 120 and the memory device 200 to allow the controller 120 to control the memory device 200 in response to a request from the host 100. The NFC 180 may generate control signals for the memory device 200 and process data under the control of the processor 140 when the memory device 150 is a flash memory and, in particular, when the memory device 150 is a NAND flash memory.

The memory 190 may serve as a working memory of the memory system 110 and the controller 120, and store data for driving the memory system 110 and the controller 120. The controller 120 may control the memory device 200 in response to a request from the host 100. For example, the controller 120 may provide the data read from the memory device 200 to the host 100, and may store the data provided from the host 100 in the memory device 200. When the controller 120 controls the operations of the memory device 200, the memory 190 may store data used by the controller 120 and the memory device 200 for such operations as read, write, program and erase operations.

The memory 190 may be implemented with a volatile memory. For example, the memory 144 may be implemented with a static random access memory (SRAM) or a dynamic random access memory (DRAM). As described above, the memory 190 may store data used by the host 100 and the memory device 200 for the write and read operations. To store data, the memory 190 may include a program memory, a data memory, a write buffer, a read buffer, a map buffer, and the like.

Additionally, the memory 190 may store data for operations between the ECC unit 160 and the processor 140, such as, for example, data that is read during read operations. That is, the memory 190 may store data read from the semiconductor memory device 200. The data may include user data, parity data and status data. The status data may include information of which cycling group is applied to the memory block 210 of the semiconductor memory device 200 during the program operation.

The processor 140 may control the general operations of the memory system 110, and a write operation or a read operation for the memory device 200, in response to a write request or a read request from the host 100. The processor 140 may drive firmware, which is referred to as a flash translation layer (FTL), to control the general operations of the memory system 110. The processor 140 may be implemented with a microprocessor or a central processing unit (CPU).

A management unit (not shown) may be included in the processor 140, and may perform bad block management of the memory device 200. The management unit may find bad memory blocks included in the memory device 200, which are in unsatisfactory condition for further use, and perform bad block management on the bad memory blocks. When the memory device 200 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks due to the program fail seriously deteriorate the utilization efficiency of the memory device 200 having a 3D stack structure and the reliability of the memory system 110, and thus reliability bad block management is required.

Figure 2:
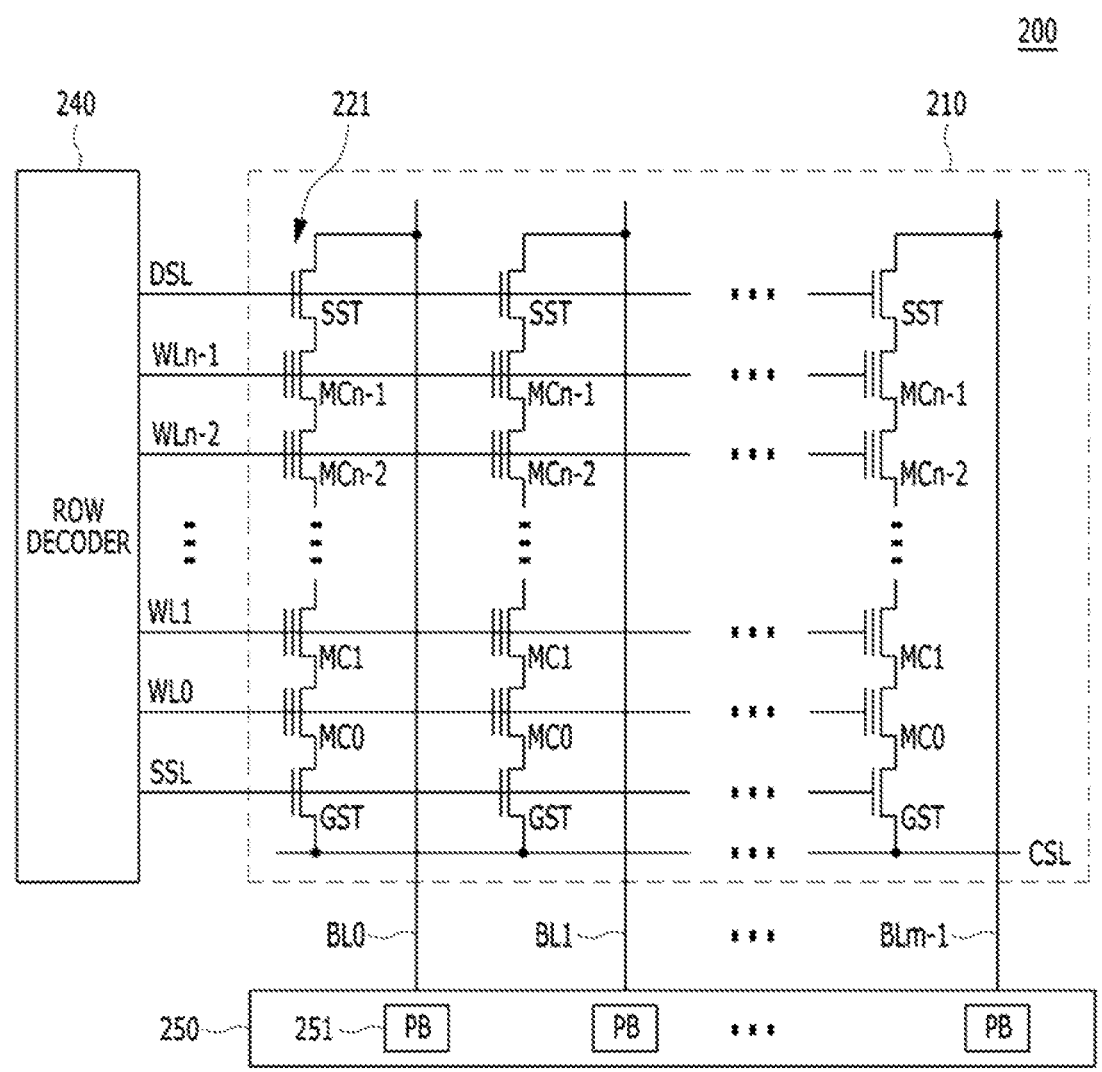
FIG. 2 is a diagram illustrating a memory cell array circuit of memory blocks in a memory device, in accordance with an embodiment of the present invention.

FIG. 2 is a block diagram illustrating a memory cell array circuit of the memory block 210 of the semiconductor memory device 200 shown in FIG. 1.

Referring to FIG. 2, the memory block 210 may include a plurality of cell strings 221 coupled to bit lines BL0 to BLm−1, respectively. The cell string 221 of each column may include one or more drain selection transistors DST and one or more source selection transistors SST. A plurality of memory cells or memory cell transistors may be serially coupled between the selection transistors DST and SST.

Each of the memory cells MC0 to MCn−1 may be formed of a multi-level cell (MLC) storing data information of a single bit of data or multiple data bits in each cell. The strings 221 may be electrically coupled to the corresponding bit lines BL0 to BLm−1, respectively.

FIG. 3 is a diagram illustrating a plurality of data groups, in accordance with an embodiment of the present invention.

According to the embodiment of FIG. 3, for example, the plurality of data groups may include first, second and third data groups DATA GROUP_1, DATA GROUP_2 and DATA GROUP_3. Each of the first to third data groups DATA GROUP_1 to DATA GROUP_3 may include a plurality of data and spare data DATA_SPARE for the plurality of data. For example, the plurality of data may be user data and include a first data DATA_1, a second data DATA_2, a third data DATA_3 and an Nth data DATA_n (e.g., a fourth data DATA_4). The spare data DATA_SPARE may include resultant bits of the exclusive OR (XOR) operation for corresponding bits of the first to fourth data DATA_1 to DATA_4.

Each of the first to third data groups may include a plurality of indexes, each index representing an address. Also, each index may correspond to each location of the bits of the plurality data. For example, the zeroth to fifteenth indexes Index 0 to Index 15 of each of the first to third data groups may include data stored during programming of the plurality of data.

Figure 4:
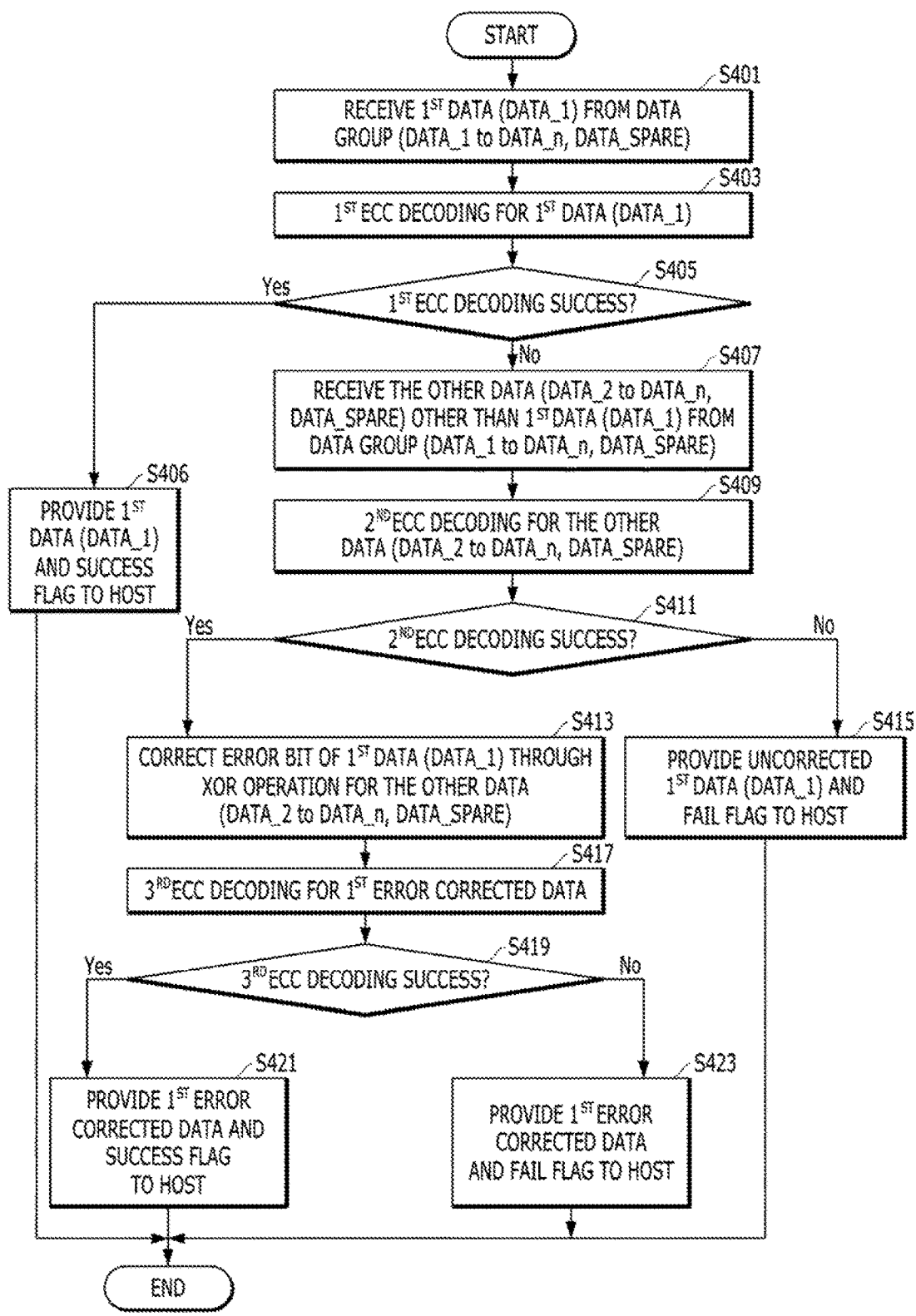
FIG. 4 is a flowchart illustrating a general operating method of a memory system.

FIG. 4 is a flowchart illustrating a general operating method of a memory system. For example, the operation of FIG. 4 may be performed by the controller 120 of FIG. 1.

According to the embodiment of FIG. 4, at step S401, the controller 120 reads the first data DATA_1, which is read-requested by the host 100, from the memory block 210 of the memory device 200. The controller 120 reads the first data DATA_1 from one of the plurality of data groups DATA GROUP_1 to DATA GROUP_3, which includes the first data. For example, the controller 120 reads the first data DATA_1 from the first data group DATA GROUP_1.

At steps S403 and S405, the controller 120 performs a first ECC decoding for detecting and correcting an error included in the first data DATA_1, and determines whether the first ECC decoding is successful.

When the first ECC decoding is successful (YES) as a result of the determination of step S405, the controller 120 provides the first data DATA_1 and a success flag (OK FLAG) to the host 100 at step S406.

However, it is possible that, the error bit of the first data DATA_1 may not be corrected through the first ECC decoding.

At step 407, when the first ECC decoding fails (NO) as a result of the determination of step S405, the controller 120 reads the remaining data included in the first data group DATA GROUP_1, i.e., the second to Nth data DATA_2 to DATA_n (e.g., DATA_4) and the spare data DATA_SPARE for correcting the error bit of the first data DATA_1.

At steps S409 and S411, the controller 120 performs a second ECC decoding for detecting and correcting an error included in the remaining data DATA_2 to DATA_4 and the spare data DATA_SPARE, and determines whether the second ECC decoding is successful.

When the second ECC decoding fails (NO) as a result of the determination of step S411, this means that there is an error bit in one or more of the remaining data DATA_2 to DATA_4 and DATA_SPARE and thus the error bit of the first data DATA_1 cannot be corrected through the remaining data DATA_2 to DATA_4 and spare data DATA_SPARE. In this case, at step S415, the controller 120 provides the first data DATA_1, which is not error-corrected, and a fail flag (FAIL FLAG) to the host 100.

At step S413, when the second ECC decoding is successful (YES) as a result of the determination of step S411, the controller 120 corrects the error bit of the first data DATA_1 by performing an XOR operation for the remaining data DATA_2 to DATA_4 and the spare DATA_SPARE in order to error-correct the error bit of the first data DATA_1. Accordingly, the first data DATA_1 is restored. For convenience of description, the first data DATA_1, which is error-corrected, is referred to as the error-corrected first data DATA_1.

At steps S417 and S419, the controller 120 performs a third ECC decoding for detecting and correcting an error included in the error-corrected first data DATA_1, and determines whether the third ECC decoding is successful.

When the third ECC decoding is successful (YES) as a result of the determination of step S419, the controller 120 provides the error-corrected first data DATA_1 and a success flag (OK FLAG) to the host 100 at step S421.

When the third ECC decoding fails (NO) as a result of the determination of step S419, the controller 120 provides the error-corrected first data DATA_1 and the fail flag (FAIL FLAG) to the host 100 at step S423.

Referring back to step S413, the controller 120 performs an XOR operation for the remaining data DATA_2 to DATA_4 and the spare data DATA_SPARE in order to error-correct the error bit of the first data DATA_1 only when there is no error bit in the remaining data DATA_2 to DATA_4 and DATA_SPARE. When there is an error bit in one or more of the remaining data DATA_2 to DATA_4 and the spare data DATA_SPARE, the error bit of the first data DATA_1 cannot be corrected through the XOR operation for the remaining data DATA_2 to DATA_4 and the spare data DATA_SPARE. A case where there is an error bit in one or more of the remaining data DATA_2 to DATA_4 and DATA_SPARE will now be described with reference to FIGS. 5 to 10.

Figure 5:
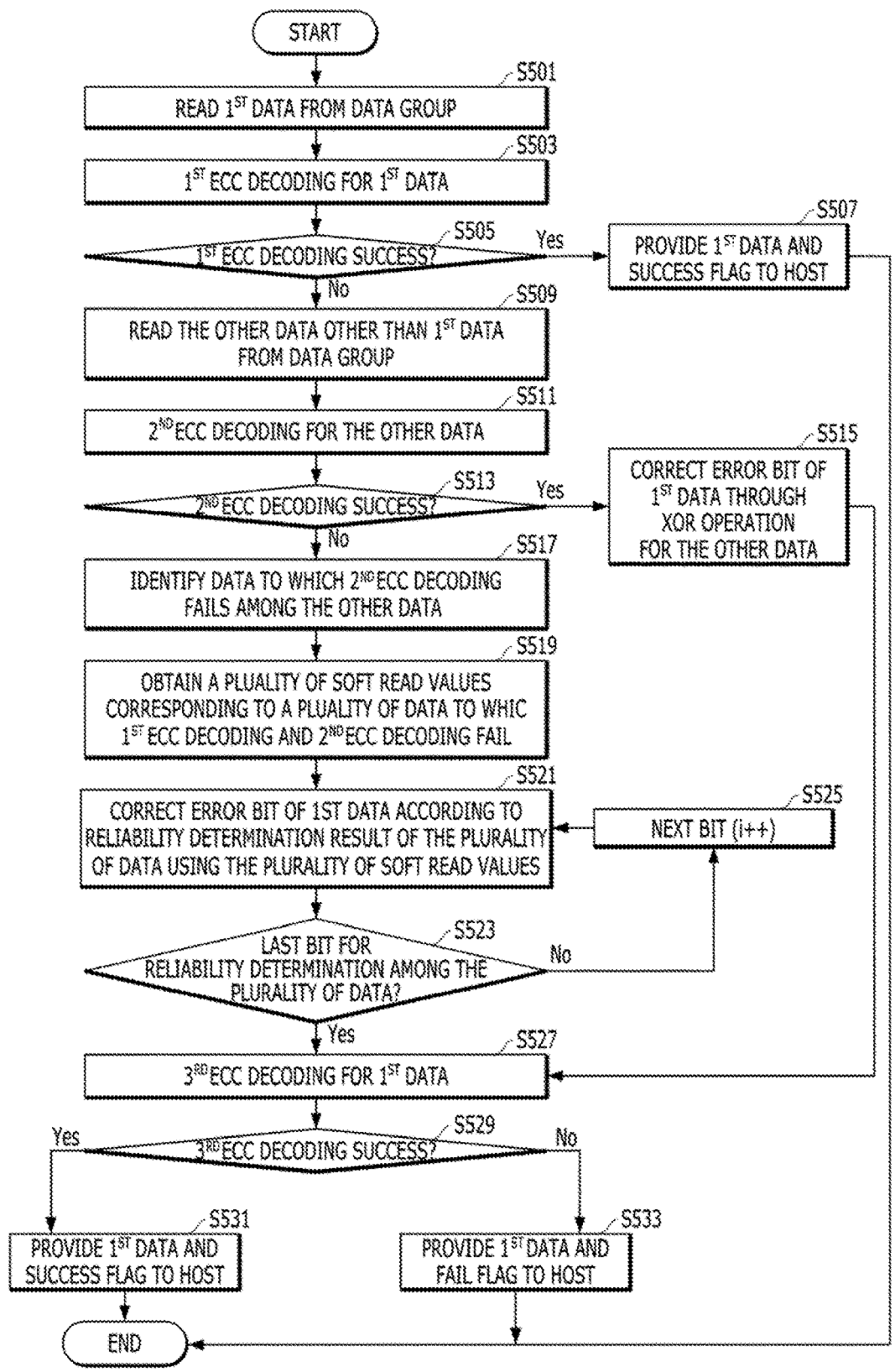
FIG. 5 is a flowchart illustrating an operating method of a memory system, in accordance with a first embodiment of the present invention.

FIG. 5 is a flowchart illustrating an operating method of a memory system, in accordance with a first embodiment of the present invention. For example, the operation of FIG. 4 may be performed by the controller 120 of FIG. 1.

According to the embodiment of FIG. 5, at step S501, the controller 120 may read the first data DATA_1, which is read-requested by the host 100, from the memory block 210 of the memory device 200. For example, the controller 120 may read the first data DATA_1 from the first data group DATA GROUP_1 of the plurality of data groups DATA GROUP_1 to DATA GROUP_3, which includes the first data DATA_1. For example, the plurality of data groups DATA GROUP_1 to DATA GROUP_3 may include a first data group DATA GROUP_1, a second data group DATA GROUP_2 and a third data group DATA GROUP_3. For example, each of the first to third data groups DATA GROUP_1 to DATA GROUP_3 may include a plurality of data DATA_1 to DATA_n (e.g., DATA_4) and spare data DATA_SPARE for the plurality of data DATA_1 to DATA_4.

At steps S503 and S505, the controller 120 may perform a first ECC decoding for detecting and correcting an error included in the first data DATA_1, and may determine whether the first ECC decoding is successful.

When the first ECC decoding is successful (YES) as a result of the determination of step S505, the controller 120 may provide the first data DATA_1 and a success flag (OK FLAG) to the host 100 at step S507.

However, it is possible that the error bit of the first data DATA_1 may not be corrected through the first ECC decoding.

In such a case, when the first ECC decoding fails (NO) as a result of the determination of step S505, the controller 120 may read the remaining data DATA_2 to DATA_4 and spare data DATA_SPARE (except for the first data DATA_1) included in the first data group DATA GROUP_1 at step S509 for correcting the error bit of the first data DATA_1.

At steps S511 and S513, the controller 120 may perform a second ECC decoding for detecting and correcting an error included in the remaining data DATA_2 to DATA_4 and the spare data DATA_SPARE, and may determine whether the second ECC decoding is successful. For example, the controller 120 may perform sequentially the second ECC decoding for the remaining data DATA_2 to DATA_4 and the spare DATA_SPARE in this order.

At step S515, when the second ECC decoding is successful (YES) as a result of the determination of step S513, the controller 120 may error-correct the error bit of the first data DATA_1 by performing an XOR operation for the remaining data DATA_2 to DATA_4 and the spare data DATA_SPARE in order to error-correct the error bit of the first data DATA_1. Accordingly, the first data DATA_1 may be restored. For convenience of description, the first data DATA_1, which is error-corrected, is referred to as the error-corrected first data DATA_1.

After performing the step S515, at steps S527 and S529, the controller 120 may perform a third ECC decoding for detecting and correcting an error included in the error-corrected first data DATA_1, and may determine whether the third ECC decoding is successful.

When the third ECC decoding is successful (YES) as a result of the determination of step S529, the controller 120 may provide the error-corrected first data DATA_1 and a success flag (OK FLAG) to the host 100 at step S531.

When the third ECC decoding fails (NO) as a result of the determination of step S529, the controller 120 may provide the error-corrected first data DATA_1 and the fail flag (FAIL FLAG) to the host 100 at step S533.

When the second ECC decoding fails (NO) as a result of determination of step S513, the controller 120 may identify data, to which the second ECC decoding fails, among the remaining data DATA_2 to DATA_4 and the spare data DATA_SPARE at step S517. The second ECC decoding to one or more of the remaining data DATA_2 to DATA_4 and the spare data DATA_SPARE may fail. For convenience of description, it is assumed that the second data DATA_2 of the remaining data DATA_2 to DATA_4 and the spare data DATA_SPARE is the one, to which the second ECC decoding fails.

At step S519, the controller 120 may obtain a plurality of soft read values respectively corresponding to the first data DATA_1, to which the first ECC decoding fails, and one or more of the remaining data DATA_2 to DATA_4 and the spare data DATA_SPARE, to which the second ECC decoding fails. For example, the controller 120 may obtain first and second soft read values corresponding to the first and second data DATA_1 and DATA_2, respectively. The controller 120 may obtain a plurality of soft read values corresponding to the first data DATA_1, to which the first ECC decoding fails, and one or more of the remaining data DATA_2 to DATA_4 and the spare data DATA_SPARE, to which the second ECC decoding fails for determining whether there is an error in each of the first data DATA_1 and one or more of the remaining data DATA_2 to DATA_4 and the spare data DATA_SPARE through determination of the reliability of the bits of the first data DATA_1 and one or more of the remaining data DATA_2 to DATA_4 and the spare data DATA_SPARE.

The controller 120 may obtain the first and second soft read values as follows. First, the controller 120 may repeat a read operation using two read voltages for each of the first data DATA_1 and one or more of the remaining data DATA_2 to DATA_4 and the spare data DATA_SPARE. The controller 120 may obtain the first and second soft read values by performing an XOR operation for data bits, which are read again, and by inverting the resultant bits of the XOR operation. For example, for obtaining the first soft read value, the controller 120 may read the first data DATA_1 through a first read voltage. Then, the controller 120 may read the first data DATA_1 through a second read voltage. The controller 120 may perform the XOR operation for the bits of the first data DATA_1, which are read respectively by the first and second voltages. The controller 120 may obtain the first soft read value corresponding to the first data DATA_1 by inverting the resultant bits of the XOR operation. The controller 120 may obtain the second soft read value corresponding to the second data DATA_2 in the same way as the first soft read value corresponding to the first data DATA_1.

Each of the first and second soft read values may include bits of high reliability and bits of low reliability. The bits of high and low reliabilities may be represented by values "1" and "0", respectively. For example, the high reliability bits may be represented by value "1" and the low reliability bits may be represented by value "0" in each of the first and second soft read values.

At step S521, the controller 120 may determine the reliability of plural bits of the first data DATA_1 and one or more of the remaining data DATA_2 to DATA_4 and spare data DATA_SPARE using the plurality of soft read values, and may error-correct the first data DATA_1 according to the determination result of the reliability step.

The controller 120 may use the first soft read value for the determination of the reliability of the bits of the first data DATA_1, and the second soft read value for the determination of the reliability of the bits of the second data DATA_2. The controller 120 may determine the reliability of the bits of the first and second data DATA_1 and DATA_2 through the first and second soft read values corresponding to the first and second data DATA_1 and DATA_2, respectively. The first data DATA_1 is read-requested by the host 100. Therefore, the controller 120 may first determine whether there is an error in the first data DATA_1 by determining the reliability of the bits of the first data DATA_1 through the first soft read value. When the bit in the first data DATA_1 is of high reliability according to the determination result of the reliability of the bits of the first data DATA_1 through the first soft read value, the controller 120 may determine that the bit of high reliability in the first data DATA_1 is not an error bit. Thus, the controller 120 may not determine the reliability of the bits of the second data DATA_2 since the controller 120 does not need to error-correct the bit of high reliability in the first data DATA_1.

When the bit in the first data DATA_1 is of low reliability according to the determination result of the reliability of the bits of the first data DATA_1 through the first soft read value, the controller 120 may determine that the bit of low reliability in the first data DATA_1 is an error bit. Thus, the controller 120 may determine the reliability of the bits of the second data DATA_2 through the second soft read value in order to error-correct the bit of low reliability in the first data DATA_1, which will now be described in detail with reference to FIG. 6.

FIG. 6 is a diagram explaining an operation for determining data reliability based on soft read values, in accordance with a first embodiment of the present invention. For example, the operation of FIG. 6 may be performed by the controller 120 of FIG. 1.

According to the embodiment of FIG. 6, the controller 120 may first determine whether there is an error in the first data DATA_1 by determining the reliability of the bits of the first data DATA_1 through the first soft read value. For example, the controller 120 may identify a bit of the first soft read value corresponding to the zeroth index (Index 0) of the first data DATA_1. The bit of the first soft read value corresponding to the zeroth index (Index 0) of the first data DATA_1 may be "1" and thus the bit of the zeroth index (Index 0) of the first data DATA_1 may be determined as one of high reliability. Since the bit of the zeroth index (Index 0) of the first data DATA_1 is determined as one of high reliability, the controller 120 may not determine the reliability of a bit of the zeroth index (Index 0) of the second data DATA_2. In this case, since the bit of the zeroth index (Index 0) of the first data DATA_1 is determined as one of high reliability, the controller 120 may not error-correct the first data DATA_1 through the remaining data DATA_2 to DATA_4 and DATA_SPARE.

For example, the controller 120 may identify a bit of the first soft read value corresponding to the fifth index (Index 5) of the first data DATA_1. The bit of the first soft read value corresponding to the fifth index (Index 5) of the first data DATA_1 may be "0" and thus the bit of the fifth index (Index 5) of the first data DATA_1 may be determined as one of low reliability or an error bit. Since the bit of the fifth index (Index 5) of the first data DATA_1 is determined as one of low reliability or an error bit, the controller 120 may determine whether a bit of the fifth index (Index 5) of the second data DATA_2 is an error bit through determination of the reliability of the bit of the fifth index (Index 5) of the second data DATA_2. As an identification result of the bit of the second soft read value corresponding to the fifth index (Index 5) of the second data DATA_2, the bit of the second soft read value corresponding to the fifth index (Index 5) of the second data DATA_2 may be "1". That is, the bit of the fifth index (Index 5) of the second data DATA_2 may be of high reliability, and thus the bit of the fifth index (Index 5) of the second data DATA_2 may not be an error bit.

Therefore, since the bit of the fifth index (Index 5) of the second data DATA_2 is of high reliability, the controller 120 may error-correct the bit of the fifth index (Index 5) of the first data DATA_1. The controller 120 may error-correct the bit of the fifth index (Index 5) of the first data DATA_1 by performing the XOR operation for the bits of the fifth index (Index 5) of the remaining data DATA_2 to DATA_4 and the spare data DATA_SPARE (except for the first data DATA_1) in the first data group DATA GROUP_1. Through the error-correction of the error bit of the first data DATA_1 by such way, a number of error bits may be reduced.

For example, the controller 120 may identify a bit of the first soft read value corresponding to the eleventh index (Index 11) of the first data DATA_1. The bit of the first soft read value corresponding to the eleventh index (Index 11) of the first data DATA_1 may be "0" and thus the bit of the eleventh index (Index 11) of the first data DATA_1 may be determined as one of low reliability or an error bit. Since the bit of the eleventh index (Index 11) of the first data DATA_1 is determined as one of low reliability or an error bit, the controller 120 may determine whether a bit of the eleventh index (Index 11) of the second data DATA_2 is an error bit through determination of the reliability of the bit of the eleventh index (Index 11) of the second data DATA_2. As an identification result of the bit of the second soft read value corresponding to the eleventh index (Index 11) of the second data DATA_2, the bit of the second soft read value corresponding to the eleventh index (Index 11) of the second data DATA_2 may be "0". That is, the bit of the eleventh index (Index 11) of the second data DATA_2 may be of row reliability, and thus the bit of the eleventh index (Index 11) of the second data DATA_2 may be an error bit.

Therefore, since the bits of the eleventh index (Index 11) of the first and second data DATA_1 and DATA_2 are of low reliability or error bits, the controller 120 may not error-correct the bit of the eleventh index (Index 11) of the first data DATA_1. As such, in case where the bits of the first and second data DATA_1 and DATA_2 are of low reliability or error bits, the controller 120 may not error-correct the error bit of the first data DATA_1 even through the XOR operation for the bits of the remaining data DATA_2 to DATA_4 and DATA_SPARE (except for the first data DATA_1) in the first data group DATA GROUP_1 since there is the error bit in the second data DATA_2 among the remaining data DATA_2 to DATA_4 and spare data DATA_SPARE. In this case, the controller 120 may error-correct the error bit of the first data DATA_1 through a third ECC decoding of step S527 of FIG. 5, which will be described later.

Referring back to FIG. 5, at step S523, the controller 120 may determine whether the bit of the plurality of data is the last bit for the reliability determination through the plurality of soft read values.

When the bit of the plurality of data is not the last bit for the reliability determination through the plurality of soft read values (NO) as a result of the determination of step S523, the controller 120 may increase the index of the bits of the first and second data DATA_1 and DATA_2 at step S525 and then may error-correct the first data DATA_1 according to the determination result of the reliability of plural bits of the first and second data DATA_1 and DATA_2 at step S521, which may be repeated until the bit of the first and second data DATA_1 and DATA_2 is the last bit for the reliability determination through the plurality of soft read values from step S519.

When the bit of the plurality of data is the last bit for the reliability determination through the plurality of soft read values (YES) as a result of the determination of step S523, the controller 120 may perform a third ECC decoding for detecting and correcting an error included in the first data DATA_1, and may determine whether the third ECC decoding is successful at steps S527 and S529.

Through the third ECC decoding, the controller 120 may detect and correct the error bit of the first data DATA_1, which is not corrected at step S521.

When the third ECC decoding is successful (YES) as a result of the determination of step S529, the controller 120 may provide the first data DATA_1 and the success flag (OK FLAG) to the host 100 at step S531.

When the third ECC decoding fails (NO) as a result of the determination of step S529, the controller 120 may provide the first data DATA_1 and the fail flag (FAIL FLAG) to the host 100 at step S533.

Figure 7:
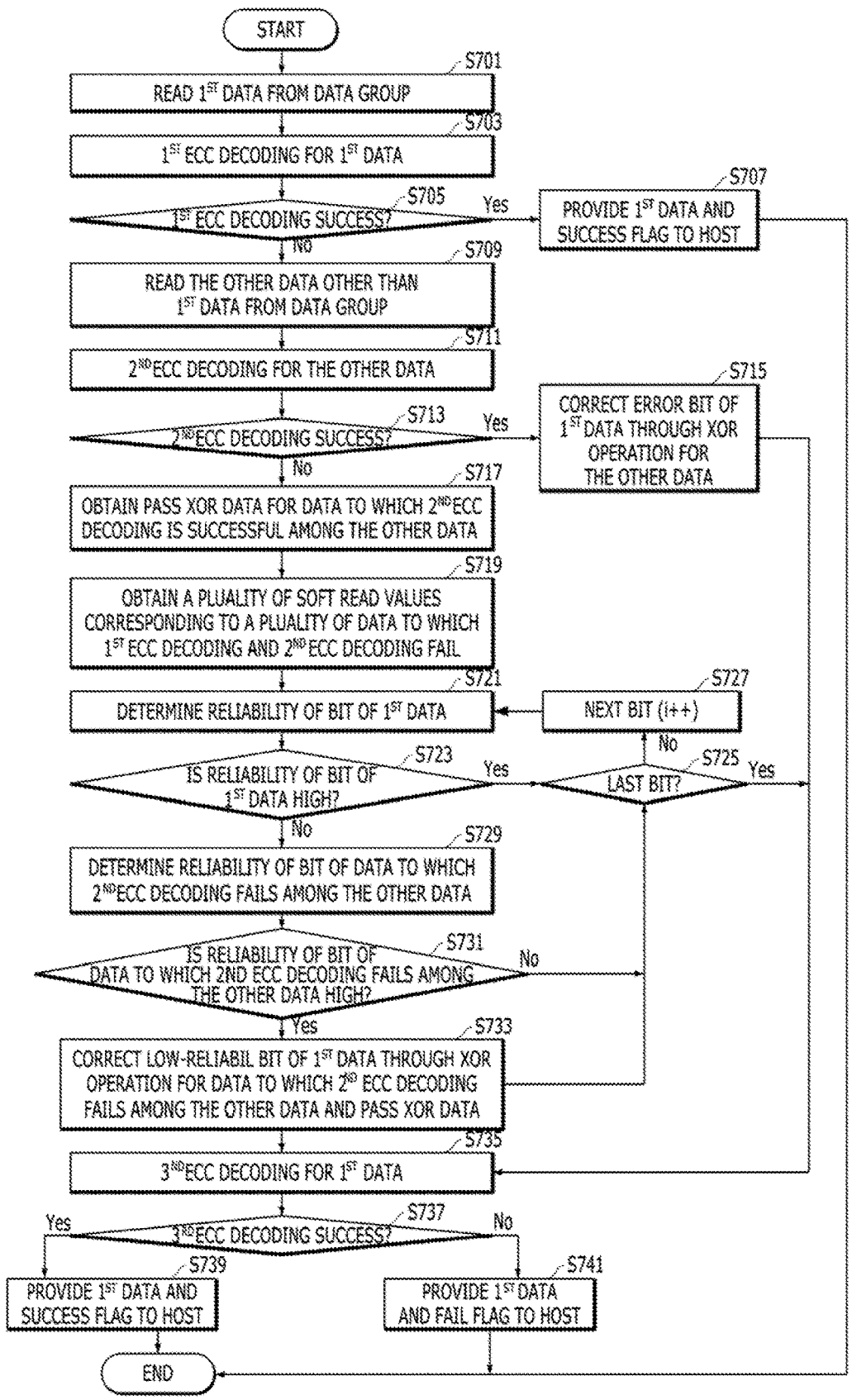
FIG. 7 is a flowchart illustrating an operating method of a memory system, in accordance with a second embodiment of the present invention.

FIG. 7 is a flowchart illustrating an operating method of a memory system, in accordance with a second embodiment of the present invention. For example, the operation of FIG. 7 may be performed by the controller 120 of FIG. 1.

According to the embodiment of FIG. 7, steps S701 to S709 may be the same as steps S501 to S509 of FIG. 5 and thus description for those steps will be omitted.

At steps S711 and S713, the controller 120 may perform a second ECC decoding for detecting and correcting an error included in the remaining data DATA_2 to DATA_4 and spare data DATA_SPARE, and may determine whether the second ECC decoding is successful. For example, the controller 120 may perform sequentially the second ECC decoding for the remaining data DATA_2 to DATA_4 and spare data DATA_SPARE in this order.

At step S715, when the second ECC decoding is successful (YES) as a result of the determination of step S713, the controller 120 may error-correct the error bit of the first data DATA_1 by performing an XOR operation for the remaining data DATA_2 to DATA_4 and spare data DATA_SPARE in order to error-correct the error bit of the first data DATA_1. Accordingly, the first data DATA_1 may be restored.

At steps S735 and S737, the controller 120 may perform a third ECC operation for the error-corrected first data DATA_1 for detecting and correcting an error bit of the error-corrected first data DATA_1, which will be described later.

When the second ECC decoding fails (NO) as a result of the determination of step S713, at step S717, the controller 120 may obtain a pass XOR data (PASS XOR DATA) by performing the XOR operation for the remaining data DATA_2 to DATA_4 and DATA_SPARE, to which the second ECC decoding is successful. The second ECC decoding for one or more of the remaining data DATA_2 to DATA_4 and DATA_SPARE may be successful.

Hereinafter, for convenience of description, it is assumed that the second ECC decoding for the second and third data DATA_2 and DATA_3 fails and the second ECC decoding for the fourth data and the spare data DATA_4 and the spare data DATA_SPARE is successful among the remaining data DATA_2 to DATA_4 and the spare data DATA_SPARE.

At step S719, the controller 120 may obtain a plurality of soft read values corresponding to respective first data DATA_1, to which the first ECC decoding fails, and one or more (i.e., DATA_2 and DATA_3) of the remaining data DATA_2 to DATA_4 and spare data DATA_SPARE, to which the second ECC decoding fails. The controller 120 may obtain first to third soft read values in the same way as the first and second soft read values of the first embodiment described above. The controller 120 may obtain first to third soft read values respectively corresponding to the first to third data DATA_1 to DATA_3. The controller 120 may obtain a plurality of soft read values respectively corresponding to the first data DATA_1, to which the first ECC decoding fails, and the second and third data DATA_2 and DATA_3, to which the second ECC decoding fails for determining whether there is an error in each of the first data DATA_1 and the second and third data DATA_2 and DATA_3 through determination of the reliability of the bits of the first data DATA_1 and the second and third data DATA_2 and DATA_3.

The controller 120 may use the first soft read value for the determination of the reliability of the bits of the first data DATA_1, the second soft read value for the determination of the reliability of the bits of the second data DATA_2, and the third soft read value for the determination of the reliability of the bits of the third data DATA_3.

At steps S721 and S723, the controller 120 may determine the reliability of the bits of the first data DATA_1 through the first soft read value corresponding to the first data DATA_1. The first data DATA_1 is read-requested by the host 100. Therefore, the controller 120 may first determine whether there is an error in the first data DATA_1 by determining the reliability of the bits of the first data DATA_1 through the first soft read value.

A case where a bit of the first data DATA_1 is of high reliability, according to the determination result of the reliability of the bits of the first data DATA_1 through the first soft read value, will now be described.

Figure 8:
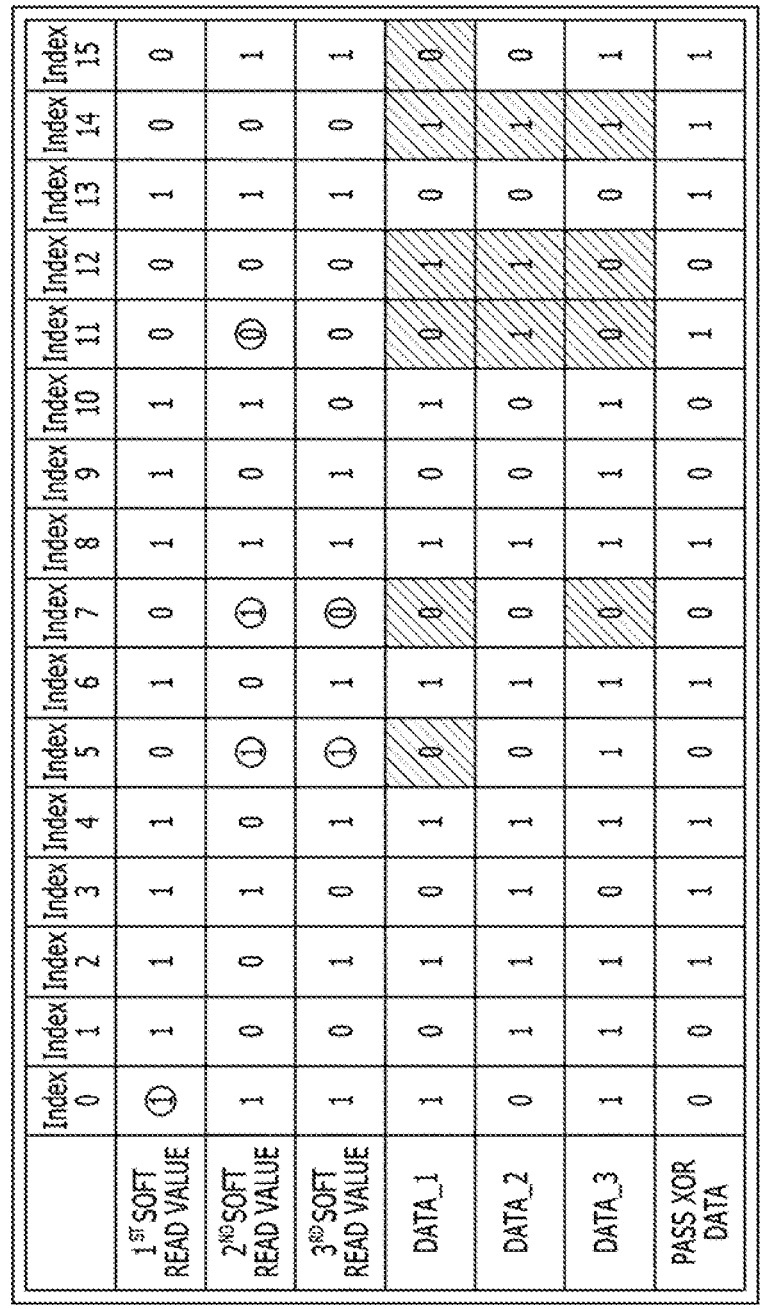
FIG. 8 is a diagram explaining an operation for determining data reliability based on soft read values in accordance with a second embodiment of the present invention.

FIG. 8 is a diagram explaining an operation for determining data reliability based on soft read values, in accordance with a second embodiment of the present invention. For example, the operation of FIG. 8 may be performed by the controller 120 of FIG. 1.

According to the embodiment of FIG. 8, the controller 120 may first determine whether there is an error in the first data DATA_1 by determining the reliability of the bits of the first data DATA_1 through the first soft read value. For example, the controller 120 may identify a bit of the first soft read value corresponding to the zeroth index (Index 0) of the first data DATA_1. The bit of the first soft read value corresponding to the zeroth index (Index 0) of the first data DATA_1 may be "1" and thus the bit of the zeroth index (Index 0) of the first data DATA_1 may be determined as one of high reliability. Since the bit of the zeroth index (Index 0) of the first data DATA_1 is determined as one of high reliability, the controller 120 may not determine the reliability of a bit of the zeroth index (Index 0) of the second data DATA_2. In this case, since the bit of the zeroth index (Index 0) of the first data DATA_1 is determined as one of high reliability, the controller 120 may not error-correct the bit of the zeroth index (Index 0) of the first data DATA_1.

Referring back to FIG. 7, when the bit of the first data DATA_1 is of high reliability (YES), as a result of the determination at step S723, the controller 120 may determine whether the bit of the first data DATA_1 is the last bit at step S725.

When the bit of the first data DATA_1 is not the last bit (NO) as a result of the determination of step S725, the controller 120 may increase the index of the bit of the first data DATA_1 at step S727 and then may repeatedly determine the reliability of the bit of the first data DATA_1 at step S721.

When the bit of the plurality of data is the last bit (YES) as a result of the determination of step S725, at step S735, the controller 120 may perform the third ECC decoding for the first data DATA_1 for detecting and correcting an error bit of the first data DATA_1, which will be described later.

A case where a bit of the first data DATA_1 is of low reliability according to the determination result of the reliability of the bits of the first data DATA_1 through the first soft read value will now be described.

When the bit of the first data DATA_1 is of low reliability (NO) as a result of the determination at step S723, the controller 120 may determine that the bit of low reliability in the first data DATA_1 is an error bit. Thus, the controller 120 may determine the reliability of the bits of the remaining data DATA_2 to DATA_4 and spare data DATA_SPARE, to which the second ECC decoding fails, at steps S729 and S731. For example, when the second ECC decoding for the second and third data DATA_2 and DATA_3 fails, the controller 120 may sequentially determine the reliability of the bits of the second and third data DATA_2 and DATA_3 through the second and third soft read values.

In accordance with an embodiment of the present invention, there may be three cases according to the reliabilities of the bits of the second and third data DATA_2 and DATA_3 when the bit of the first data DATA_1 is of low reliability. A first case is when the bit of the second data DATA_2 is of high reliability and the bit of the third data DATA_3 is of low reliability. A second case is when the bit of the second data DATA_2 is of low reliability. A third case is when the bit of the second data DATA_2 is of high reliability and the bit of the third data DATA_3 is of high reliability.

The first case where the bit of the second data DATA_2 is of high reliability and the bit of the third data DATA_3 is of low reliability will now be described.

Referring back to FIG. 8, the controller 120 may determine the reliability of the bits of the second and third data DATA_2 and DATA_3 through the second and third soft read values. For example, the controller 120 may identify a bit of the second soft read value corresponding to the seventh index (Index 7) of the second data DATA_2. The bit of the second soft read value corresponding to the seventh index (Index 7) of the second data DATA_2 may be "1" and thus the bit of the seventh index (Index 7) of the second data DATA_2 may be determined as one of high reliability.

Then, the controller 120 may identify a bit of the third soft read value corresponding to the seventh index (Index 7) of the third data DATA_3. The bit of the third soft read value corresponding to the seventh index (Index 7) of the third data DATA_3 may be "0" and thus the bit of the seventh index (Index 7) of the third data DATA_3 may be determined as one of low reliability. That is, the low-reliability bit of the seventh index (Index 7) of the third data DATA_3 may be determined as an error bit. Therefore, the controller 120 may not correct the error bit of the seventh index (Index 7) of the first data DATA_1 since the bit of the third data DATA_3 is determined to be an error bit.

Referring back to FIG. 7, when the bit of the remaining data DATA_2 to DATA_4 and DATA_SPARE, to which the second ECC decoding fails, is of low reliability (NO), as a result of the determination of step S731 (for example, when the bit of the second data DATA_2 is of high reliability and the bit of the third data DATA_3 is of low reliability), the controller 120 may determine whether the bit of the first data DATA_1 is the last bit at step S725.

When the bit of the first data DATA_1 is not the last bit (NO), as a result of the determination of step S725, the controller 120 may increase the index of the bit of the first data DATA_1 at step S727 and then may repeatedly determine the reliability of the bit of the first data DATA_1 at step S721.

When the bit of the first data DATA_1 is the last bit (YES), as a result of the determination of step S725, the controller 120 may perform the third ECC decoding for the first data DATA_1 for detecting and correcting an error bit of the first data DATA_1, which will be described later.

The second case where the bit of the second data DATA_2 is of low reliability will now be described.

Referring back to FIG. 8, the controller 120 may identify a bit of the second soft read value corresponding to the eleventh index (Index 11) of the second data DATA_2. The bit of the second soft read value corresponding to the eleventh index (Index 11) of the second data DATA_2 may be "0" and thus the bit of the eleventh index (Index 11) of the second data DATA_2 may be determined as one of low reliability. For example, the low-reliability bit of the eleventh index (Index 11) of the second data DATA_2 may be determined as an error bit. Therefore, the controller 120 may not determine the bit of the third data DATA_3 since the condition for the error-correction of the error bit of the first data DATA_1 is not satisfied.

Referring back to FIG. 7, when the bit of the remaining data DATA_2 to DATA_4 and the spare data DATA_SPARE, to which the second ECC decoding fails, is of low reliability (NO) as a result of the determination of step S731 (for example, when the bit of the second data DATA_2 is of low reliability and thus the controller 120 does not determine the bit of the third data DATA_3), the controller 120 may determine whether the bit of the first data DATA_1 is the last bit at step S725 since the error bit of the first data DATA_1 cannot be corrected. Step S725 is described above and thus description for step S725 will be omitted.

The third case where both of the bits of the second and third data DATA_2 and DATA_3 are of high reliability will now be described. Referring back to FIG. 8, the controller 120 may determine the reliability of the bits of the second and third data DATA_2 and DATA_3 through the second and third soft read values. For example, the controller 120 may identify a bit of the second soft read value corresponding to the fifth index (Index 5) of the second data DATA_2. The bit of the second soft read value corresponding to the fifth index (Index 5) of the second data DATA_2 may be "1" and thus the bit of the fifth index (Index 5) of the second data DATA_2 may be determined as one of high reliability.

Then, the controller 120 may of the third soft read value corresponding to the fifth index (Index 5) of the third data DATA_3. The bit of the third soft read value corresponding to the fifth index (Index 5) of the third data DATA_3 may be "1" and thus the bit of the fifth index (Index 5) of the third data DATA_3 may be determined as one of high reliability. That is, the high reliability bit of the fifth index (Index 5) of the third data DATA_3 may not be determined as an error bit. Therefore, the controller 120 may correct the error bit of the fifth index (Index 5) of the first data DATA_1.

Referring back to FIG. 7, when the bit of the remaining data DATA_2 to DATA_4 and spare data DATA_SPARE, to which the second ECC decoding fails, is of high reliability (YES) as a result of the determination of step S731 (for example, when both of the bits of the second and third data DATA_2 and DATA_3 are of high reliability), the controller 120 may error-correct the low-reliability bit of the first data DATA_1 by performing the XOR operation for the bits of the remaining data DATA_2 to DATA_4 and DATA_SPARE, to which the second ECC decoding fails, and the pass XOR data (PASS XOR DATA) at step S733. For example, according to the embodiment of FIG. 8, the controller 120 may correct the error bit of the fifth index (Index 5) of the first data DATA_1 by performing the XOR operation for the bits of the fifth index (Index 5) of the second and third data DATA_2 and DATA_3 and the bit of the fifth index (Index 5) of pass XOR data (PASS XOR DATA). Through the error-correction of the error bit of the first data DATA_1 by such way, a number of error bits may be reduced.

At steps S735 and S737, the controller 120 may perform a third ECC decoding for detecting and correcting an error included in the first data DATA_1, and may determine whether the third ECC decoding is successful. Through the third ECC decoding, the controller 120 may detect and correct the error bit of the first data DATA_1, which is not corrected through the reliability determination steps.

When the third ECC decoding is successful (YES) as a result of the determination of step S737, the controller 120 may provide the first data DATA_1 and the success flag (OK FLAG) to the host 100 at step S739.

When the third ECC decoding fails (NO) as a result of the determination of step S737, the controller 120 may provide the first data DATA_1 and the fail flag (FAIL FLAG) to the host 100 at step S741.

Figure 9:
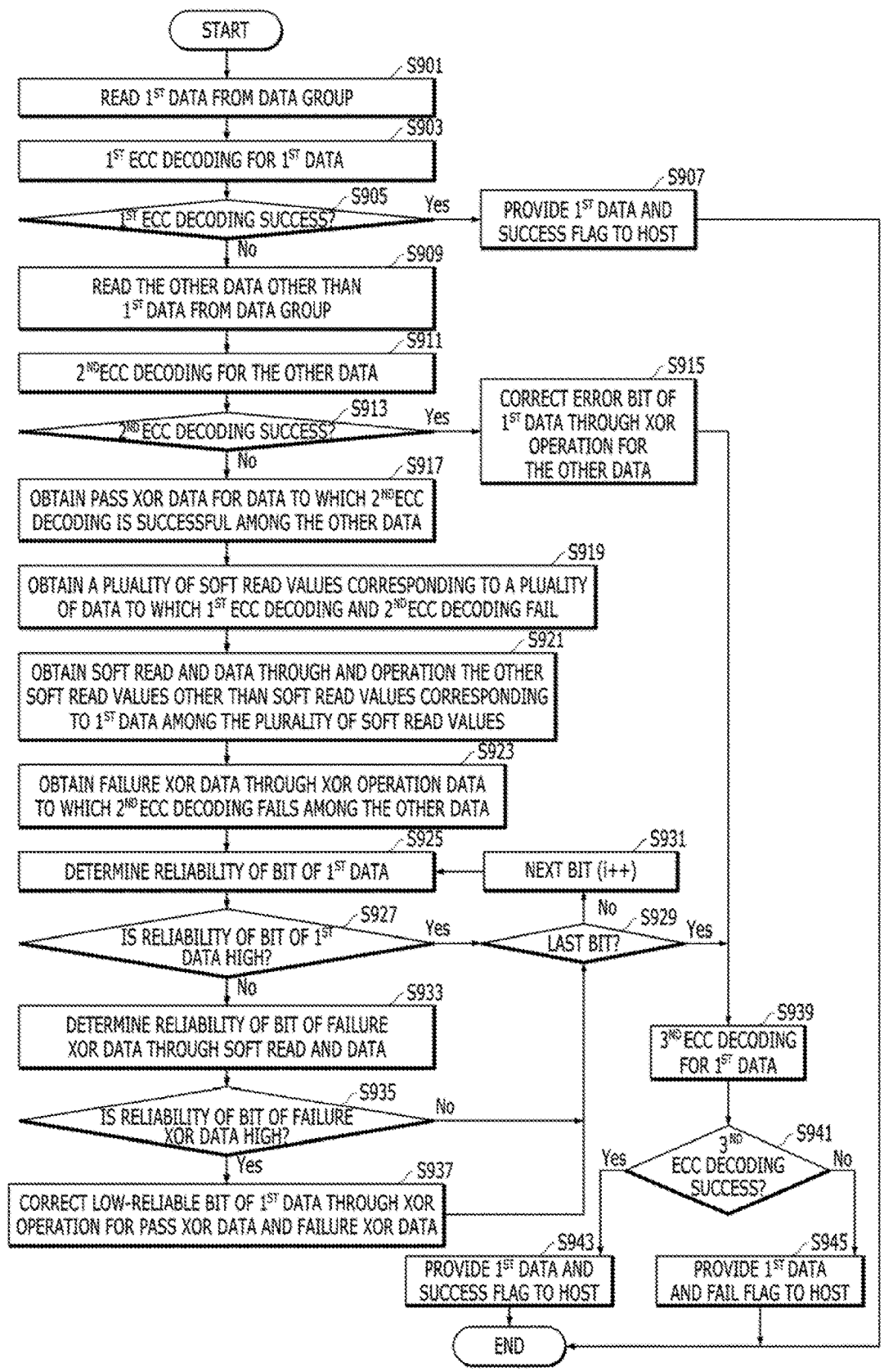
FIG. 9 is a flowchart illustrating an operating method of a memory system in accordance with a third embodiment of the present invention.

FIG. 9 is a flowchart illustrating an operating method of a memory system, in accordance with a third embodiment of the present invention. For example, the operation of FIG. 9 may be performed by the controller 120 of FIG. 1.

According to the embodiment of FIG. 9, steps S901 to S909 may be the same as steps S501 to S509 of FIG. 5 and thus description for those steps will be omitted.

At steps S911 and S913, the controller 120 may perform a second ECC decoding for detecting and correcting an error included in the remaining data DATA_2 to DATA_4 and DATA_SPARE, and may determine whether the second ECC decoding is successful. That is, the controller 120 may perform sequentially the second ECC decoding for the remaining data DATA_2 to DATA_4 and spare data DATA_SPARE, for example in the recited order.

When the second ECC decoding is successful (YES) as a result of the determination of step S913, the controller 120 may error-correct the error bit of the first data DATA_1 by performing an XOR operation for the remaining data DATA_2 to DATA_4 and DATA_SPARE at step S915 in order to error-correct the error bit of the first data DATA_1. Accordingly, the first data DATA_1 may be restored.

After performing the step S915, the controller 120 may perform a third ECC operation for the error-corrected first data DATA_1 at steps S939 and S941 for detecting and correcting an error bit of the error-corrected first data DATA_1, which will be described later.

When the second ECC decoding fails (NO) as a result of the determination of step S913, at step S917, the controller 120 may obtain a pass XOR data (PASS XOR DATA) by performing the XOR operation for one or more of the remaining data DATA_2 to DATA_4 and spare data DATA_SPARE, to which the second ECC decoding is successful. The second ECC decoding for one or more of the remaining data DATA_2 to DATA_4 and spare data DATA_SPARE may be successful.

Hereinafter, for convenience of description, it is assumed that the second ECC decoding for the second and third data DATA_2 and DATA_3 fails and the second ECC decoding for the fourth data and the spare data DATA_4 and spare data DATA_SPARE is successful among the remaining data DATA_2 to DATA_4 and spare data DATA_SPARE.

At step S919, the controller 120 may obtain a plurality of soft read values respectively corresponding to the first data DATA_1, to which the first ECC decoding fails, and one or more (i.e., DATA_2 and DATA_3) of the remaining data DATA_2 to DATA_4 and DATA_SPARE, to which the second ECC decoding fails. The controller 120 may obtain first to third soft read values in the same way as the first and second soft read values of the first embodiment described above. The controller 120 may obtain first to third soft read values corresponding to the first to third data DATA_1 to DATA_3, respectively. The controller 120 may obtain a plurality of soft read values respectively corresponding to the first data DATA_1, to which the first ECC decoding fails, and the second and third data DATA_2 and DATA_3, to which the second ECC decoding fails for determining whether there is an error in each of the first data DATA_1 and the second and third data DATA_2 and DATA_3 through determination of the reliability of the bits of the first data DATA_1 and the second and third data DATA_2 and DATA_3.

At step S921, the controller 120 may obtain a logical and soft read value (SOFT READ AND DATA) by performing AND operation for the other soft read values other than the first soft read value corresponding to the first data DATA_1. For example, the controller 120 may obtain the logical and soft read value (SOFT READ AND DATA) by performing AND operation for the second and third soft read values other than the first soft read value corresponding to the first data DATA_1 among the first to third soft read values.

At step S923, the controller 120 may obtain fail XOR data (FAIL XOR DATA) by performing the XOR operation for one or more of the remaining data DATA_2 to DATA_4 and spare data DATA_SPARE, to which the second ECC decoding fails.

At steps S925 and S927, the controller 120 may determine the reliability of the bits of the first data DATA_1 through the first soft read value corresponding to the first data DATA_1. The first data DATA_1 is read-requested by the host 100. Therefore, the controller 120 may first determine whether there is an error in the first data DATA_1 by determining the reliability of the bits of the first data DATA_1 through the first soft read value.

A case where a bit of the first data DATA_1 is of high reliability according to the determination result of the reliability of the bits of the first data DATA_1 through the first soft read value will now be described.

Figure 10:
FIG. 10 is a diagram explaining an operation for determining data reliability based on soft read values, in accordance with a third embodiment of the present invention.

FIG. 10 is a diagram explaining an operation for determining data reliability based on soft read values, in accordance with a third embodiment of the present invention. For example, the operation of FIG. 10 may be performed by the controller 120 of FIG. 1.

According to the embodiment of FIG. 10, the controller 120 may first determine whether there is an error in the first data DATA_1 by determining the reliability of the bits of the first data DATA_1 through the first soft read value. For example, the controller 120 may identify a bit of the first soft read value corresponding to the zeroth index (Index 0) of the first data DATA_1. The bit of the first soft read value corresponding to the zeroth index (Index 0) of the first data DATA_1 may be "1" and thus the bit of the zeroth index (Index 0) of the first data DATA_1 may be determined as one of high reliability. Since the bit of the zeroth index (Index 0) of the first data DATA_1 is determined as one of high reliability, the controller 120 may not determine the reliability of a bit of the zeroth index (Index 0) of the second data DATA_2. In this case, since the bit of the zeroth index (Index 0) of the first data DATA_1 is determined as one of high reliability, the controller 120 may not error-correct the bit of the zeroth index (Index 0) of the first data DATA_1.

Referring back to FIG. 9, when the bit of the first data DATA_1 is of high reliability (YES) as a result of the reliability determination to the bits of the first data DATA_1 through the first soft read value at step S927, the controller 120 may determine whether the bit of the first data DATA_1 is the last bit at step S929.

When the bit of the first data DATA_1 is not the last bit (NO) as a result of the determination of step S929, the controller 120 may increase the index of the bit of the first data DATA_1 at step S931 and then may repeatedly determine the reliability of the bit of the first data DATA_1 at step S925.

When the bit of the plurality of data is the last bit (YES) as a result of the determination of step S929, at the step S939, the controller 120 may perform the third ECC decoding for the first data DATA_1 for detecting and correcting an error bit of the first data DATA_1, which will be described later.

A case where a bit of the first data DATA_1 is of low reliability according to the determination result of the reliability of the bits of the first data DATA_1 through the first soft read value will now be described.

When the bit of the first data DATA_1 is of low reliability (NO) as a result of the reliability determination to the bits of the first data DATA_1 through the first soft read value at step S927, the controller 120 may determine that the bit of low reliability in the first data DATA_1 is an error bit. Thus, the controller 120 may determine the reliability of the bits of the fail XOR data (FAIL XOR DATA) through the logical and soft read value (SOFT READ AND DATA) at steps S933 and S935.

In accordance with an embodiment of the present invention, there may be two cases according to the reliabilities of the bits of the fail XOR data (FAIL XOR DATA) when the bit of the first data DATA_1 is of low reliability. A first case is when the bit of the fail XOR data (FAIL XOR DATA) is of high reliability. A second case is when the bit of the fail XOR data (FAIL XOR DATA) is of low reliability.

The first case where the bit of the fail XOR data (FAIL XOR DATA) is of high reliability will now be described.

Referring back to FIG. 10, the controller 120 may identify a bit of the logical and soft read value (SOFT READ AND DATA) corresponding to the fifth index (Index 5) of the fail XOR data (FAIL XOR DATA). The bit of the logical and soft read value (SOFT READ AND DATA) corresponding to the fifth index (Index 5) of the fail XOR data (FAIL XOR DATA) may be "1" and thus the bit of the fifth index (Index 5) of the fail XOR data (FAIL XOR DATA) may be determined as one of high reliability.

Referring back to FIG. 9, when the bit of the fail XOR data (FAIL XOR DATA) is of high reliability (YES) as a result of the reliability determination to the bit of the fail XOR data (FAIL XOR DATA) through the logical and soft read value (SOFT READ AND DATA) at step S935, the controller 120 may correct the low-reliability error bit of the fifth index (Index 5) of the first data DATA_1 through the pass XOR data (PASS XOR DATA) and the fail XOR data (FAIL XOR DATA) at step S937.

After performing the step S937, at step S929, the controller 120 may determine whether the bit of the first data DATA_1 is the last bit.

When the bit of the first data DATA_1 is not the last bit (NO) as a result of the determination of step S929, the controller 120 may increase the index of the bits of the first data DATA_1 at step S931 and then may repeatedly determine the reliability of the bits of the first data DATA_1 at step S925.

When the bit of the first data DATA_1 is the last bit (YES) as a result of the determination of step S929, the controller 120 may perform the third ECC decoding for the first data DATA_1 for detecting and correcting an error bit of the first data DATA_1 at steps S939 and S941, which will be described later.

The second case where the bit of the fail XOR data (FAIL XOR DATA) is of low reliability will now be described.

Referring back to FIG. 10, the controller 120 may identify a bit of the logical and soft read value (SOFT READ AND DATA) corresponding to the eleventh index (Index 11) of the fail XOR data (FAIL XOR DATA). The bit of the logical and soft read value (SOFT READ AND DATA) corresponding to the eleventh index (Index 11) of the fail XOR data (FAIL XOR DATA) may be "0" and thus the bit of the eleventh index (Index 11) of the fail XOR data (FAIL XOR DATA) may be determined as one of low reliability. That is, the low-reliability bit of the eleventh index (Index 11) of the fail XOR data (FAIL XOR DATA) may be determined as an error bit. Therefore, the controller 120 may not error-correct the first data DATA_1.

Referring back to FIG. 9, when the bit of the fail XOR data (FAIL XOR DATA) is of low reliability (NO) as a result of the reliability determination to the bit of the fail XOR data (FAIL XOR DATA) through the logical and soft read value (SOFT READ AND DATA) at step S935, the controller 120 may proceed to step S929.

At step S929, the controller 120 may determine whether the bits of the first data DATA_1 and the fail XOR data (FAIL XOR DATA) are the last bits. When the bits of the first data DATA_1 and the fail XOR data (FAIL XOR DATA) are not the last bits (NO) as a result of the determination of step S929, the controller 120 may increase the index of the bits of the first data DATA_1 and the fail XOR data (FAIL XOR DATA) at step S931 and then may repeatedly perform steps from step S925.

When the bits of the first data DATA_1 and the fail XOR data (FAIL XOR DATA) are the last bits (YES) as a result of the determination of step S929, the controller 120 may perform the third ECC decoding for the error-corrected first data DATA_1 for detecting and correcting an error bit of the error-corrected first data DATA_1 at steps S939 and S941.

When the third ECC decoding for the error-corrected first data DATA_1 is successful (YES) as a result of the determination of step S941, the controller 120 may provide the first data DATA_1 and the success flag (OK FLAG) to the host 100 at step S943.

When the third ECC decoding for the error-corrected first data DATA_1 fails (NO) as a result of the determination of step S941, the controller 120 may provide the first data DATA_1 and the fail flag (FAIL FLAG) to the host 100 at step S945.

FIGS. 11 to 18 are schematic diagrams illustrating the memory device 150 shown in FIG. 1.

Figure 11:
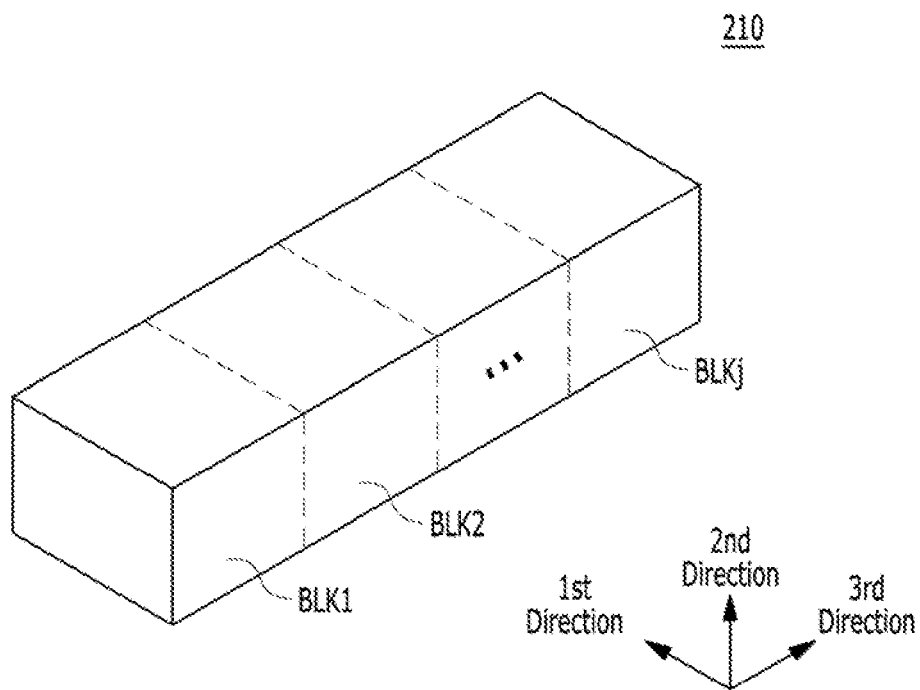
FIGS. 11 to 15 are diagrams illustrating a three-dimensional (3D) nonvolatile memory device, in accordance with an embodiment of the present invention.

FIG. 11 is a block diagram illustrating an example of the memory blocks 210 of the memory device 200 shown in FIG. 1. According to the embodiment of FIG. 11, the memory blocks 210 of the memory device 200 may include a plurality of memory blocks BLK1 to BLKj. Each of the memory blocks BLK1 to BLKj may have a three-dimensional (3D) structure or a vertical structure. For example, each of the memory blocks BLK1 to BLKj may include structures which extend in first to third directions, for example, an x-axis direction, a y-axis direction and a z-axis direction.

Each of the memory blocks BLK1 to BLKj may include a plurality of NAND strings NS which extend in the second direction. The plurality of NAND strings NS may be provided in the first direction and the third direction.

The respective NAND strings NS may be electrically coupled to a bit line BL, at least one source select line SSL, at least one ground select line GSL, a plurality of word lines WL, at least one dummy word lines DWL, and a common source line CSL. Namely, the respective memory blocks BLK1 to BLKj may be electrically coupled to a plurality of bit lines BL, a plurality of string select lines SSL, a plurality of ground select lines GSL, a plurality of word lines WL, a plurality of dummy word lines DWL, and a plurality of common source lines CSL.

Figure 12:
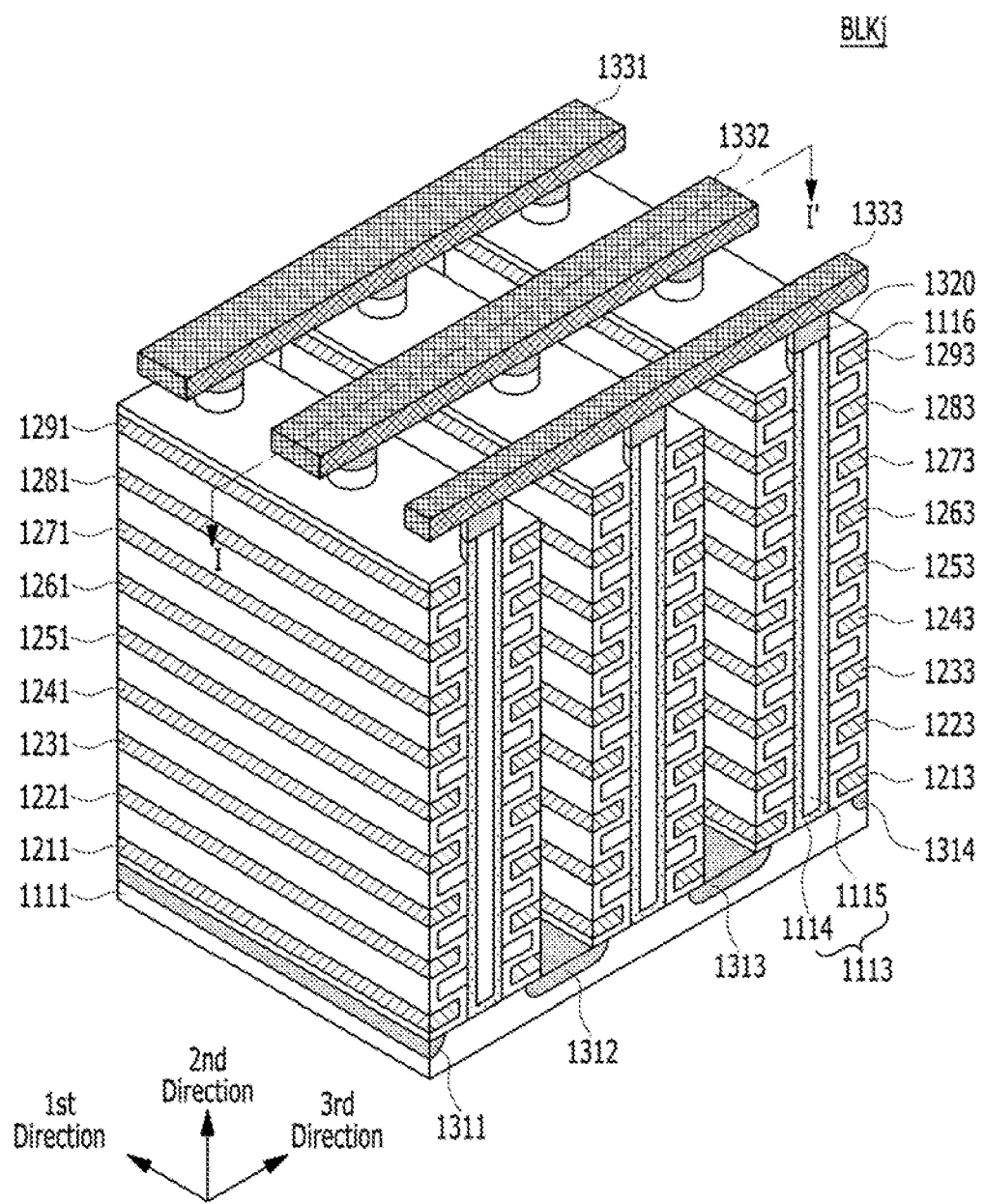
Figure 13:
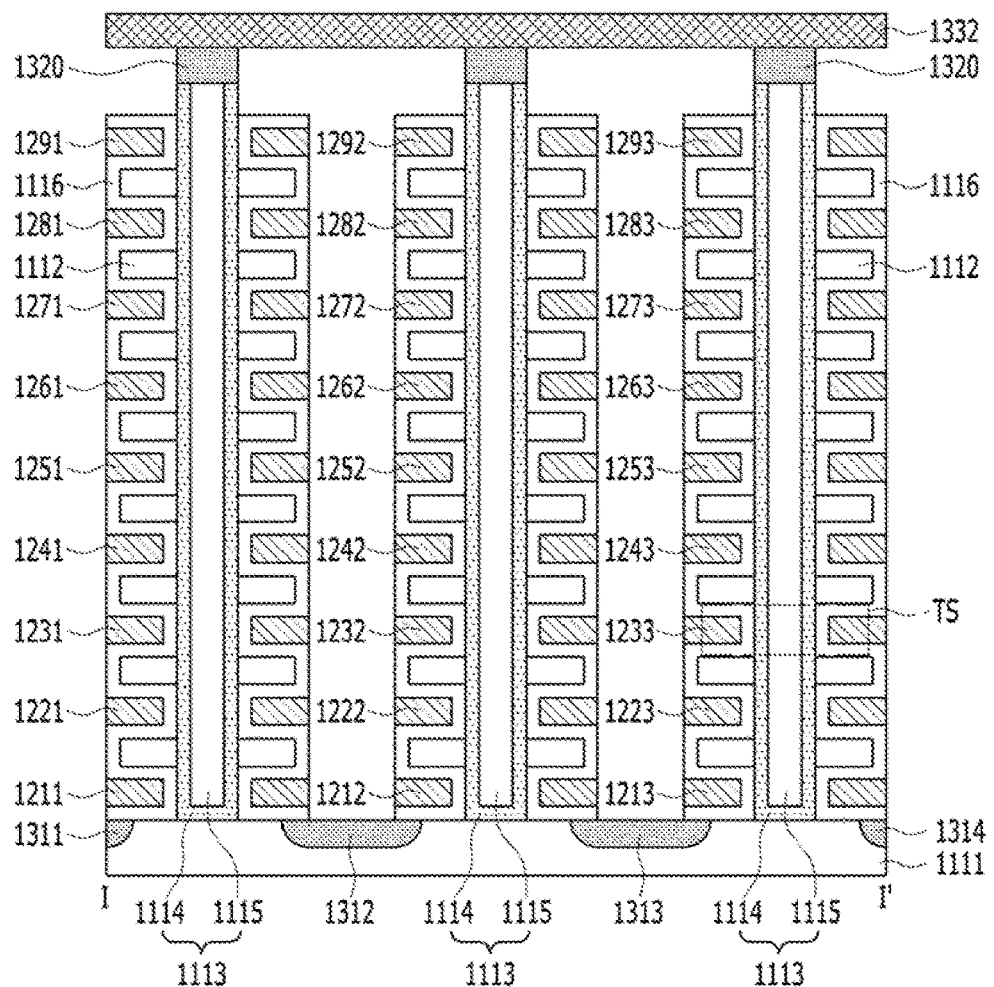

FIG. 12 is a perspective view of one memory block BLKj of the memory blocks BLK1 to BLKj shown in FIG. 11. FIG. 13 is a cross-sectional view taken along a line I-I' of the memory block BLKj shown in FIG. 12.

According to the embodiment of FIGS. 12 and 13, a memory block BLKj among the plurality of memory blocks 210 of the memory device 200 may include a structure which extends in the first to third directions.

A substrate 1111 may be provided. The substrate 1111 may include a silicon material doped by a first type impurity. The substrate 1111 may include a silicon material doped by a p-type impurity or may be a p-type well, for example, a pocket p-well, and include an n-type well which surrounds the p-type well. While it is assumed that the substrate 1111 is p-type silicon, it is to be noted that the substrate 1111 is not limited to p-type silicon.

A plurality of doping regions 1311 to 1314 which extend in the first direction may be provided over the substrate 1111. The plurality of doping regions 1311 to 1314 may contain a second type of impurity that is different from the substrate 1111. The plurality of doping regions 1311 to 1314 may be doped with an n-type impurity. While it is assumed here that first to fourth doping regions 1311 to 1314 are n-type, it is to be noted that the first to fourth doping regions 1311 to 1314 are not limited to being n-type.

In the region over the substrate 1111 between the first and second doping regions 1311 and 1312, a plurality of insulation materials 1112 which extend in the first direction may be sequentially provided in the second direction. The insulation materials 1112 and the substrate 1111 may be separated from one another by a predetermined distance in the second direction. The dielectric materials 1112 may be separated from one another by a predetermined distance in the second direction. The dielectric materials 1112 may include a dielectric material such as silicon oxide.

In the region over the substrate 1111 between the first and second doping regions 1311 and 1312, a plurality of pillars 1113 which are sequentially disposed in the first direction and pass through the dielectric materials 1112 in the second direction may be provided. The plurality of pillars 1113 may respectively pass through the dielectric materials 1112 and may be electrically coupled with the substrate 1111. Each pillar 1113 may be configured by a plurality of materials. The surface layer 1114 of each pillar 1113 may include a silicon material doped with the first type of impurity. The surface layer 1114 of each pillar 1113 may include a silicon material doped with the same type of impurity as the substrate 1111. While it is assumed here that the surface layer 1114 of each pillar 1113 may include p-type silicon, the surface layer 1114 of each pillar 1113 is not limited to being p-type silicon.

An inner layer 1115 of each of the pillars 1113 may be formed of a dielectric material. The inner layer 1115 of each pillar 1113 may be filled by a dielectric material such as silicon oxide.

In the region between the first and second doping regions 1311 and 1312, a dielectric layer 1116 may be provided along the exposed surfaces of the dielectric materials 1112, the pillars 1113, and the substrate 1111. The thickness of the dielectric layer 1116 may be less than one half of the distance between the dielectric materials 1112. For example, a region, in which a material other than the dielectric materials 1112 and the dielectric layer 1116 may be disposed, may be provided between (i) the dielectric layer 1116 provided over the bottom surface of a first dielectric material of the dielectric materials 1112 and (ii) the dielectric layer 1116 provided over the top surface of a second dielectric material of the dielectric materials 1112. The dielectric materials 1112 lie below the first dielectric material.

In the region between the first and second doping regions 1311 and 1312, conductive materials 1211 to 1291 may be provided over the exposed of the dielectric layer 1116. The conductive material 1211 which extends in the first direction may be provided between the dielectric material 1112 adjacent to the substrate 1111 and the substrate 5111. In particular, the conductive material 1211 which extends in the first direction may be provided between (i) the dielectric layer 1116 disposed over the substrate 1111 and (ii) the dielectric layer 1116 disposed over the bottom surface of the dielectric material 1112 adjacent to the substrate 1111.

The conductive material which extends in the first direction may be provided between (i) the dielectric layer 1116 disposed over the top surface of one of the dielectric materials 1112 and (ii) the dielectric layer 1116 disposed over the bottom surface of another dielectric material of the dielectric materials 1112, which is disposed over the certain dielectric material 1112. The conductive materials 1221 to 1281 which extend in the first direction may be provided between the dielectric materials 1112. The conductive material 1291 which extends in the first direction may be provided over the uppermost dielectric material 1112. The conductive materials 1211 to 1291 which extend in the first direction may be a metallic material. The conductive materials 1211 to 1291 which extend in the first direction may be a conductive material such as polysilicon.

In the region between the second and third doping regions 1312 and 1313, the same structures as the structures between the first and second doping regions 1311 and 1312 may be provided. For example, in the region between the second and third doping regions 1312 and 1313, the plurality of insulation materials 1112 which extend in the first direction, the plurality of pillars 1113 which are sequentially arranged in the first direction and pass through the plurality of dielectric materials 1112 in the second direction, the dielectric layer 1116 which is provided over the exposed surfaces of the plurality of dielectric materials 1112 and the plurality of pillars 1113, and the plurality of conductive materials 1212 to 1292 which extend in the first direction may be provided.

In the region between the third and fourth doping regions 1313 and 1314, the same structure as between the first and second doping regions 1311 and 1312 may be provided. For example, in the region between the third and fourth doping regions 1313 and 1314, the plurality of dielectric materials 1112 which extend in the first direction, the plurality of pillars 1113 which are sequentially arranged in the first direction and pass through the plurality of dielectric materials 1112 in the second direction, the dielectric layer 1116 which is provided over the exposed surfaces of the plurality of dielectric materials 1112 and the plurality of pillars 1113, and the plurality of conductive materials 1213 to 1293 which extend in the first direction may be provided.

Drains 1320 may be respectively provided over the plurality of pillars 1113. The drains 1320 may be silicon materials doped with second type impurities. The drains 1320 may be silicon materials doped with n-type impurities. While it is assumed for the sake of convenience that the drains 1320 include n-type silicon, it is to be noted that the drains 1320 are not limited to being n-type silicon. For example, the width of each drain 1320 may be larger than the width of each corresponding pillars 1113. Each drain 1320 may be provided in the shape of a pad over the top surface of each corresponding pillar 1113.

Conductive materials 1331 to 1333 which extend in the third direction may be provided over the drains 1320. The conductive materials 1331 to 1333 may be sequentially disposed in the first direction. The respective conductive materials 1331 to 1333 may be electrically coupled with the drains 1320 of corresponding regions. The drains 1320 and the conductive materials 1331 to 1333 which extend in the third direction may be electrically coupled with through contact plugs. The conductive materials 1331 to 1333 which extend in the third direction may be a metallic material. The conductive materials 1331 to 1333 which extend in the third direction may be a conductive material such as polysilicon.

According to the embodiment of FIGS. 12 and 13, the respective pillars 1113 may form strings together with the dielectric layer 1116 and the conductive materials 1211 to 1291, 1212 to 1292 and 1213 to 1293 which extend in the first direction. The respective pillars 1113 may form NAND strings NS together with the dielectric layer 1116 and the conductive materials 1211 to 1291, 1212 to 1292, and 1213 to 1293 which extend in the first direction. Each NAND string NS may include a plurality of transistor structures TS.

Figure 14:
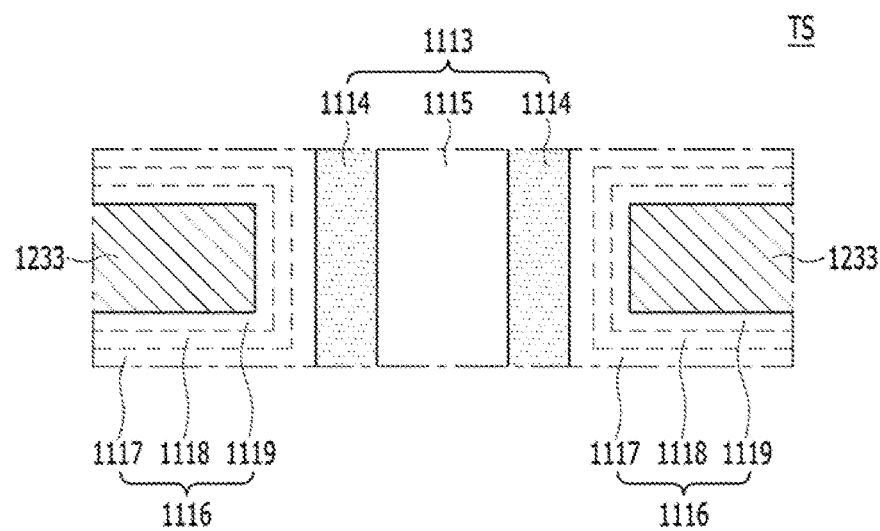

FIG. 14 is a cross-sectional view of the transistor structure TS shown in FIG. 13.

According to the embodiment of FIG. 14, in the transistor structure TS shown in FIG. 13, the dielectric layer 1116 may include first to third sub dielectric layers 1117, 1118 and 1119.

The surface layer 1114 of p-type silicon in each of the pillars 1113 may serve as a body. The first sub dielectric layer 1117 adjacent to the pillar 1113 may serve as a tunneling dielectric layer, and may include a thermal oxidation layer.

The second sub dielectric layer 1118 may serve as a charge storing layer. The second sub dielectric layer 1118 may serve as a charge capturing layer, and may include a nitride layer or a metal oxide layer such as an aluminum oxide layer, a hafnium oxide layer, or the like.

The third sub dielectric layer 1119 adjacent to the conductive material 1233 may serve as a blocking dielectric layer. The third sub dielectric layer 1119 adjacent to the conductive material 1233 which extends in the first direction may be formed as a single layer or multiple layers. The third sub dielectric layer 1119 may be a high-k dielectric layer such as an aluminum oxide layer, a hafnium oxide layer, or the like, which has a dielectric constant greater than the first and second sub dielectric layers 1117 and 1118.

The conductive material 1233 may serve as a gate or a control gate. That is, the gate or the control gate 1233, the blocking dielectric layer 1119, the charge storing layer 1118, the tunneling dielectric layer 1117 and the body 1114 may form a transistor or a memory cell transistor structure. For example, the first to third sub dielectric layers 1117 to 1119 may form an oxide-nitride-oxide (ONO) structure. In the embodiment, for the sake of convenience, the surface layer 1114 of p-type silicon in each of the pillars 1113 will be referred to as a body in the second direction.

The memory block BLKj may include the plurality of pillars 1113. Namely, the memory block BLKj may include the plurality of NAND strings NS. In detail, the memory block BLKj may include the plurality of NAND strings NS which extend in the second direction or a direction perpendicular to the substrate 1111.

Each NAND string NS may include the plurality of transistor structures TS which are disposed in the second direction. At least one of the plurality of transistor structures TS of each NAND string NS may serve as a string source transistor SST. At least one of the plurality of transistor structures TS of each NAND string NS may serve as a ground select transistor GST.

The gates or control gates may correspond to the conductive materials 1211 to 1291, 1212 to 1292 and 1213 to 1293 which extend in the first direction. For example, the gates or the control gates may extend in the first direction and form word lines and at least two select lines, at least one source select line SSL and at least one ground select line GSL.

The conductive materials 1331 to 1333 which extend in the third direction may be electrically coupled to one end of the NAND strings NS. The conductive materials 1331 to 1333 which extend in the third direction may serve as bit lines BL. That is, in one memory block BLKi, the plurality of NAND strings NS may be electrically coupled to one bit line BL.

The second type doping regions 1311 to 1314 which extend in the first direction may be provided to the other ends of the NAND strings NS. The second type doping regions 1311 to 1314 which extend in the first direction may serve as common source lines CSL.

Namely, the memory block BLKi may include a plurality of NAND strings NS which extend in a direction perpendicular to the substrate 1111, e.g., the second direction, and may serve as a NAND flash memory block, for example, of a charge capturing type memory, in which a plurality of NAND strings NS are electrically coupled to one bit line BL.

While it is illustrated in FIGS. 12 to 14 that the conductive materials 1211 to 1291, 1212 to 1292 and 1213 to 1293 which extend in the first direction are provided in 9 layers, it is to be noted that the conductive materials 1211 to 1291, 1212 to 1292 and 1213 to 1293 which extend in the first direction are not limited to being provided in 9 layers. For example, conductive materials which extend in the first direction may be provided in 8 layers, 16 layers or any multiple of layers. For example, in one NAND string NS, the number of transistors may be 8, 16 or more. While it is illustrated in FIGS. 12 to 14 that 3 NAND strings NS are electrically coupled to one bit line BL, it is to be noted that the embodiment is not limited to having 3 NAND strings NS that are electrically coupled to one bit line BL. In the memory block BLKj, m number of NAND strings NS may be electrically coupled to one bit line BL, m being a positive integer. According to the number of NAND strings NS which are electrically coupled to one bit line BL, the number of conductive materials 1211 to 1291, 1212 to 1292 and 1213 to 1293 which extend in the first direction and the number of common source lines 1311 to 1314 may be controlled as well.

Further, while it is illustrated in FIGS. 12 to 14 that 3 NAND strings NS are electrically coupled to one conductive material which extends in the first direction, it is to be noted that the embodiment is not limited to having 3 NAND strings NS electrically coupled to one conductive material which extends in the first direction. For example, n number of NAND strings NS may be electrically coupled to one conductive material which extends in the first direction, n being a positive integer. According to the number of NAND strings NS which are electrically coupled to one conductive material which extends in the first direction, the number of bit lines 1331 to 1333 may be controlled as well.

Figure 15:
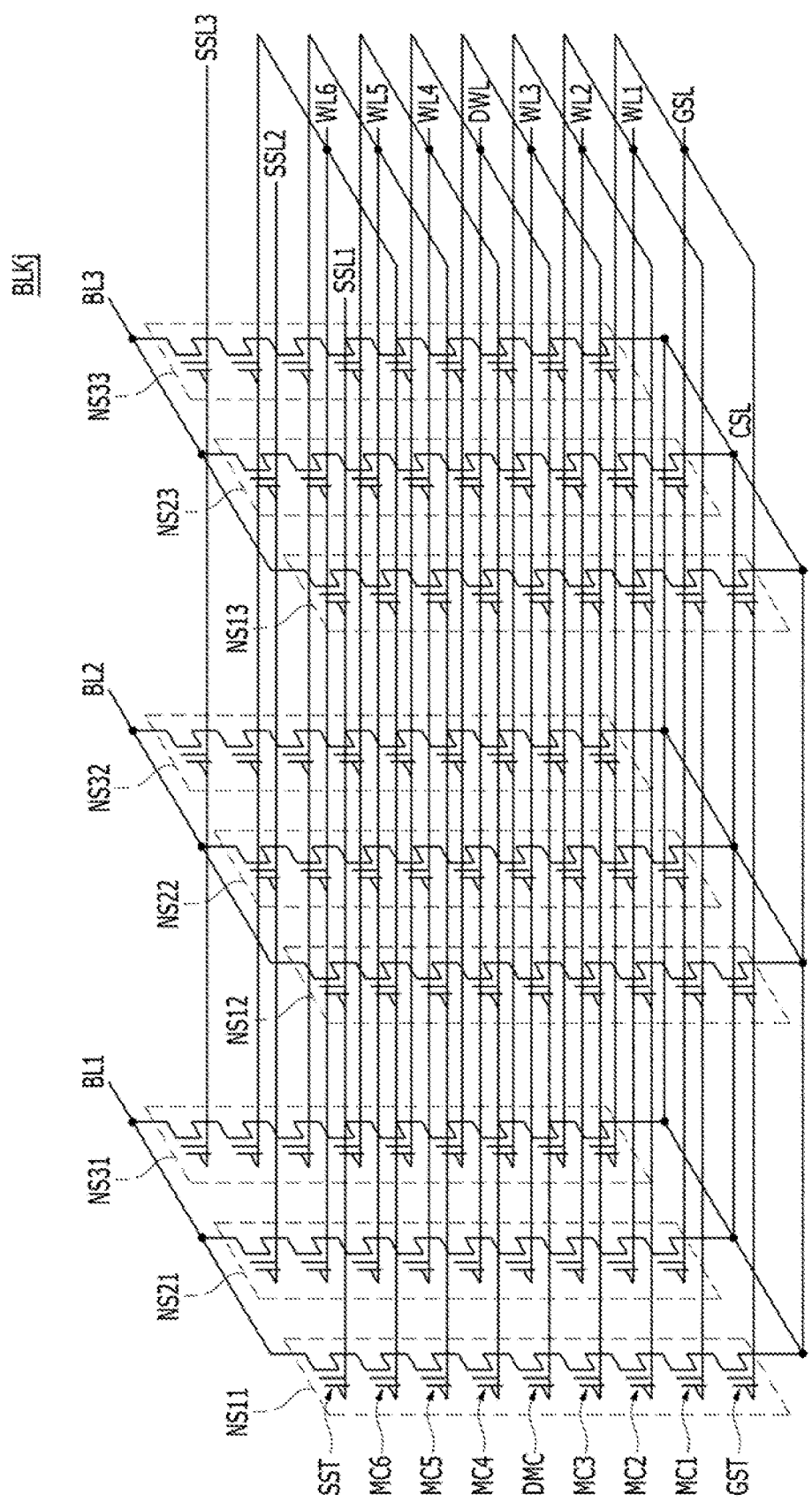

FIG. 15 is an equivalent circuit diagram illustrating the memory block BLKj having a first structure described with reference to FIGS. 12 to 14.

According to the embodiment of FIG. 15, in a block BLKj having the first structure, NAND strings NS11 to NS31 may be provided between a first bit line BL1 and a common source line CSL. The first bit line BL1 may correspond to the conductive material 1331 first bit line BL1 may correspond to the conductive material 1332 of FIGS. 12 and 13, which extends in the third direction. NAND strings NS12 to NS32 may be provided between a second bit line BL2 and the common source line CSL. The second bit line BL2 may correspond to the conductive material 1332 of FIGS. 12 and 13, which extends in the third direction. NAND strings NS13 to NS33 may be provided between a third bit line BL3 and the common source line CSL. The third bit line BL3 may correspond to the conductive material 1333 of FIGS. 12 and 13, which extends in the third direction.

A source select transistor SST of each NAND string NS may be electrically coupled to a corresponding bit line BL. A ground select transistor GST of each NAND string NS may be electrically coupled to the common source line CSL. Memory cells MC may be provided between the source select transistor SST and the ground select transistor GST of each NAND string NS.

In this example, NAND strings NS may be defined by units of rows and columns and NAND strings NS which are electrically coupled to one bit line may form one column. The NAND strings NS11 to NS31 which are electrically coupled to the first bit line BL1 may correspond to a first column, the NAND strings NS12 to NS32 which are electrically coupled to the second bit line BL2 may correspond to a second column, and the NAND strings NS13 to NS33 which are electrically coupled to the third bit line BL3 may correspond to a third column. NAND strings NS which are electrically coupled to one source select line SSL may form one row. The NAND strings NS11 to NS13 which are electrically coupled to a first source select line SSL1 may form a first row, the NAND strings NS21 to NS23 which are electrically coupled to a second source select line SSL2 may form a second row, and the NAND strings NS31 to NS33 which are electrically coupled to a third source select line SSL3 may form a third row.

In each NAND string NS, a height may be defined. In each NAND string NS, the height of a memory cell MC1 adjacent to the ground select transistor GST may have a value '1'. In each NAND string NS, the height of a memory cell may increase as the memory cell gets closer to the source select transistor SST when measured from the substrate 1111. In each NAND string NS, the height of a memory cell MC6 adjacent to the source select transistor SST may be 7.

The source select transistors SST of the NAND strings NS in the same row may share the source select line SSL. The source select transistors SST of the NAND strings NS in different rows may be respectively electrically coupled to the different source select lines SSL1, SSL2 and SSL3.

The memory cells at the same height in the NAND strings NS in the same row may share a word line WL. That is, at the same height, the word lines WL electrically coupled to the memory cells MC of the NAND strings NS in different rows may be electrically coupled. Dummy memory cells DMC at the same height in the NAND strings NS of the same row may share a dummy word line DWL. Namely, at the same height or level, the dummy word lines DWL electrically coupled to the dummy memory cells DMC of the NAND strings NS in different rows may be electrically coupled.

The word lines WL or the dummy word lines DWL located at the same level or height or layer may be electrically coupled with one another at layers where the conductive materials 1211 to 1291, 1212 to 1292 and 1213 to 1293 which extend in the first direction may be provided. The conductive materials 1211 to 1291, 1212 to 1292 and 1213 to 1293 which extend in the first direction may be electrically coupled in common to upper layers through contacts.

At the upper layers, the conductive materials 1211 to 1291, 1212 to 1292 and 1213 to 1293 which extend in the first direction may be electrically coupled. For example, the ground select transistors GST of the NAND strings NS in the same row may share the ground select line GSL. Further, the ground select transistors GST of the NAND strings NS in different rows may share the ground select line GSL. That is, the NAND strings NS11 to NS13, NS21 to NS23 and NS31 to NS33 may be electrically coupled to the ground select line GSL.

The common source line CSL may be electrically coupled to the NAND strings NS. Over the active regions and over the substrate 1111, the first to fourth doping regions 1311 to 1314 may be electrically coupled. The first to fourth doping regions 1311 to 1314 may be electrically coupled to an upper layer through contacts and, at the upper layer, the first to fourth doping regions 1311 to 1314 may be electrically coupled.

Namely, as shown in FIG. 15, the word lines WL of the same height or level may be electrically coupled. Accordingly, when a word line WL at a specific height is selected, all NAND strings NS which are electrically coupled to the word line WL may be selected. The NAND strings NS in different rows may be electrically coupled to different source select lines SSL. Accordingly, among the NAND strings NS electrically coupled to the same word line WL, by selecting one of the source select lines SSL1 to SSL3, the NAND strings NS in the unselected rows may be electrically isolated from the bit lines BL1 to BL3. For example, by selecting one of the source select lines SSL1 to SSL3, a row of NAND strings NS may be selected. Moreover, by selecting one of the bit lines BL1 to BL3, the NAND strings NS in the selected rows may be selected in units of columns.

In each NAND string NS, a dummy memory cell DMC may be provided. In FIG. 15, the dummy memory cell DMC may be provided between a third memory cell MC3 and a fourth memory cell MC4 in each NAND string NS. That is, first to third memory cells MC1 to MC3 may be provided between the dummy memory cell DMC and the ground select transistor GST. Fourth to sixth memory cells MC4 to MC6 may be provided between the dummy memory cell DMC and the source select transistor SST. The memory cells MC of each NAND string NS may be divided into memory cell groups by the dummy memory cell DMC. In the divided memory cell groups, memory cells, for example, MC1 to MC3, adjacent to the ground select transistor GST may be referred to as a lower memory cell group, and memory cells, for example, MC4 to MC6, adjacent to the string select transistor SST may be referred to as an upper memory cell group.

As described in FIGS. 11 to 15, a semiconductor memory system may include one or more cell strings arranged in a direction perpendicular to a substrate coupled with a memory controller and including memory cells, a string select transistor and a ground select transistor. The semiconductor memory system may operate as follow: (a) may be provided with a first read command to perform first and second hard decision read operations in response to a first hard decision read voltage and a second hard decision read voltage that is different from the first hard decision read voltage; (b) may acquire hard decision data; (c) may select one of the first and second hard decision voltages based on an error bit state of the hard decision data; (d) may acquire soft decision data in response to a soft read voltage that is different from the first and second hard decision read voltages; and (e) may provide the soft decision data to a memory controller.

Hereinbelow, detailed descriptions will be made with reference to FIGS. 16 to 18, which show the memory device in the memory system according to an embodiment implemented with a three-dimensional (3D) nonvolatile memory device different from the first structure.

Figure 16:
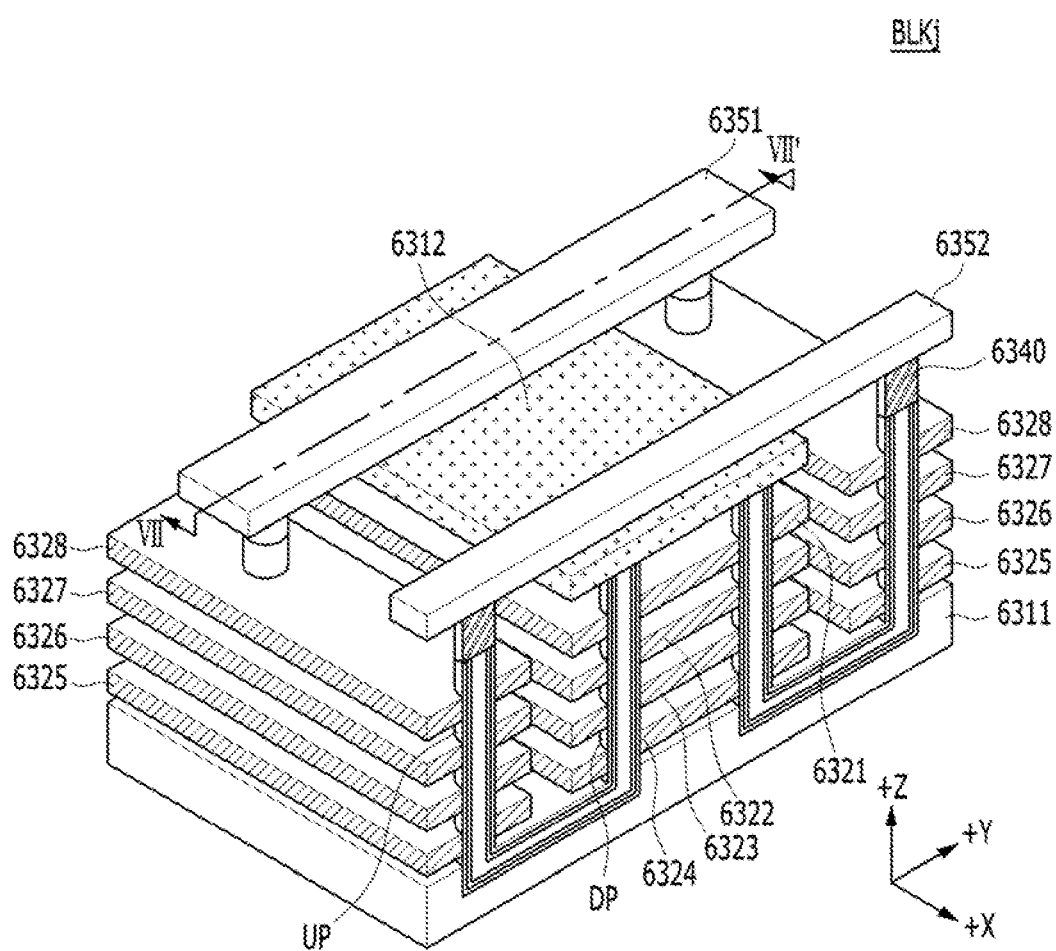
FIGS. 16 to 18 are diagrams illustrating a three-dimensional (3D) nonvolatile memory device, in accordance with another embodiment of the present invention.

FIG. 16 is a perspective view schematically illustrating the memory device implemented with the three-dimensional (3D) nonvolatile memory device, which is different from the first structure described above with reference to FIGS. 12 to 15, and showing a memory block BLKj of the plurality of memory blocks of FIG. 11. FIG. 17 is a cross-sectional view illustrating the memory block BLKj taken along the line VII-VII' of FIG. 16.

Figure 17:
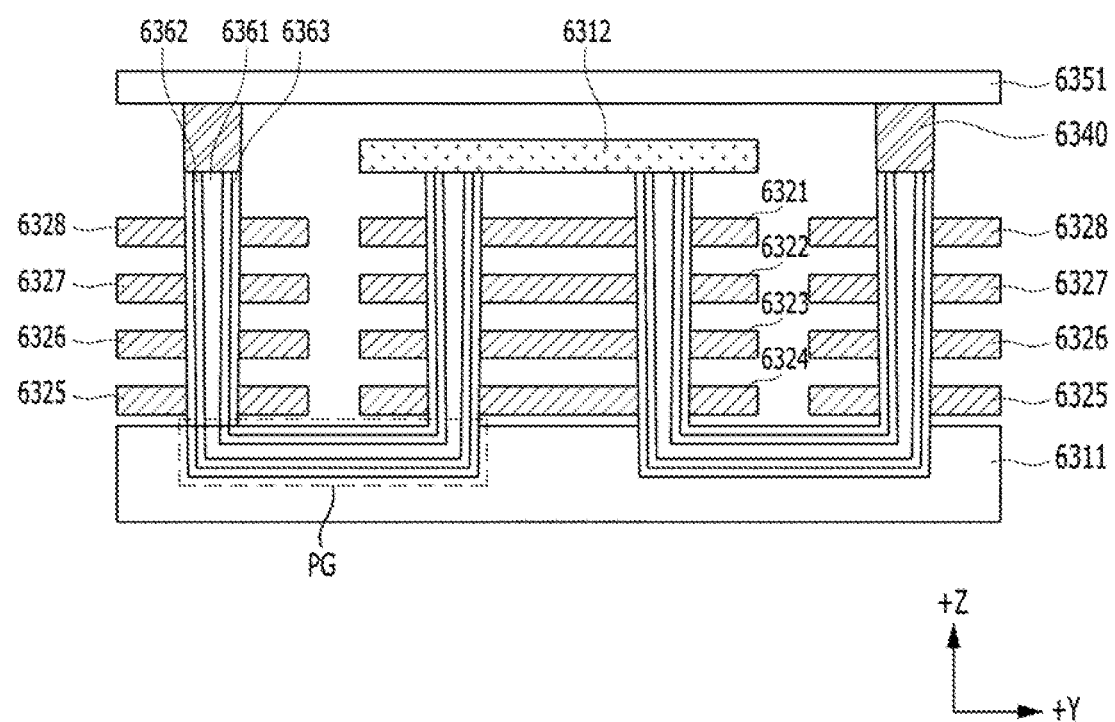

According to the embodiment of FIGS. 16 and 17, the memory block BLKj among the plurality of memory blocks of the memory device 200 of FIG. 1 may include structures which extend in the first to third directions.

A substrate 6311 may be provided. For example, the substrate 6311 may include a silicon material doped with a first type impurity. For example, the substrate 6311 may include a silicon material doped with a p-type impurity or may be a p-type well, for example, a pocket p-well, and include an n-type well which surrounds the p-type well. While it is assumed in the embodiment for the sake of convenience that the substrate 6311 is p-type silicon, it is to be noted that the substrate 6311 is not limited to being p-type silicon.

First to fourth conductive materials 6321 to 6324 which extend in the x-axis direction and the y-axis direction are provided over the substrate 6311. The first to fourth conductive materials 6321 to 6324 may be separated by a predetermined distance in the z-axis direction.

Fifth to eighth conductive materials 6325 to 6328 which extend in the x-axis direction and the y-axis direction may be provided over the substrate 6311. The fifth to eighth conductive materials 6325 to 6328 may be separated by the predetermined distance in the z-axis direction. The fifth to eighth conductive materials 6325 to 6328 may be separated from the first to fourth conductive materials 6321 to 6324 in the y-axis direction.

A plurality of lower pillars DP which pass through the first to fourth conductive materials 6321 to 6324 may be provided. Each lower pillar DP extends in the z-axis direction. Also, a plurality of upper pillars UP which pass through the fifth to eighth conductive materials 6325 to 6328 may be provided. Each upper pillar UP extends in the z-axis direction.

Each of the lower pillars DP and the upper pillars UP may include an internal material 6361, an intermediate layer 6362, and a surface layer 6363. The intermediate layer 6362 may serve as a channel of the cell transistor. The surface layer 6363 may include a blocking dielectric layer, a charge storing layer and a tunneling dielectric layer.

The lower pillar DP and the upper pillar UP may be electrically coupled through a pipe gate PG. The pipe gate PG may be disposed in the substrate 6311. For instance, the pipe gate PG may include the same material as the lower pillar DP and the upper pillar UP.

A doping material 6312 of a second type which extends in the x-axis direction and the y-axis direction may be provided over the lower pillars DP. For example, the doping material 6312 of the second type may include an n-type silicon material. The doping material 6312 of the second type may serve as a common source line CSL.

Drains 6340 may be provided over the upper pillars UP. The drains 6340 may include an n-type silicon material. First and second upper conductive materials 6351 and 6352 which extend in the y-axis direction may be provided over the drains 6340.

The first and second upper conductive materials 6351 and 6352 may be separated in the x-axis direction. The first and second upper conductive materials 6351 and 6352 may be formed of a metal. The first and second upper conductive materials 6351 and 6352 and the drains 6340 may be electrically coupled through contact plugs. The first and second upper conductive materials 6351 and 6352 respectively serve as first and second bit lines BL1 and BL2.

The first conductive material 6321 may serve as a source select line SSL, the second conductive material 6322 may serve as a first dummy word line DWL1, and the third and fourth conductive materials 6323 and 6324 serve as first and second main word lines MWL1 and MWL2, respectively. The fifth and sixth conductive materials 6325 and 6326 serve as third and fourth main word lines MWL3 and MWL4, respectively, the seventh conductive material 6327 may serve as a second dummy word line DWL2, and the eighth conductive material 6328 may serve as a drain select line DSL.

The lower pillar DP and the first to fourth conductive materials 6321 to 6324 adjacent to the lower pillar DP form a lower string. The upper pillar UP and the fifth to eighth conductive materials 6325 to 6328 adjacent to the upper pillar UP form an upper string. The lower string and the upper string may be electrically coupled through the pipe gate PG. One end of the lower string may be electrically coupled to the doping material 6312 of the second type which serves as the common source line CSL. One end of the upper string may be electrically coupled to a corresponding bit line through the drain 6340. One lower string and one upper string form one cell string which is electrically coupled between the doping material 6312 of the second type serving as the common source line CSL and a corresponding one of the upper conductive material layers 6351 and 6352 serving as the bit line BL.

That is, the lower string may include a source select transistor SST, the first dummy memory cell DMC1, and the first and second main memory cells MMC1 and MMC2. The upper string may include the third and fourth main memory cells MMC3 and MMC4, the second dummy memory cell DMC2, and a drain select transistor DST.

In FIGS. 16 and 17, the upper string and the lower string may form a NAND string NS, and the NAND string NS may include a plurality of transistor structures TS. Since the transistor structure included in the NAND string NS in FIGS. 16 and 17 is described above in detail with reference to FIG. 14, a detailed description thereof will be omitted herein.

Figure 18:
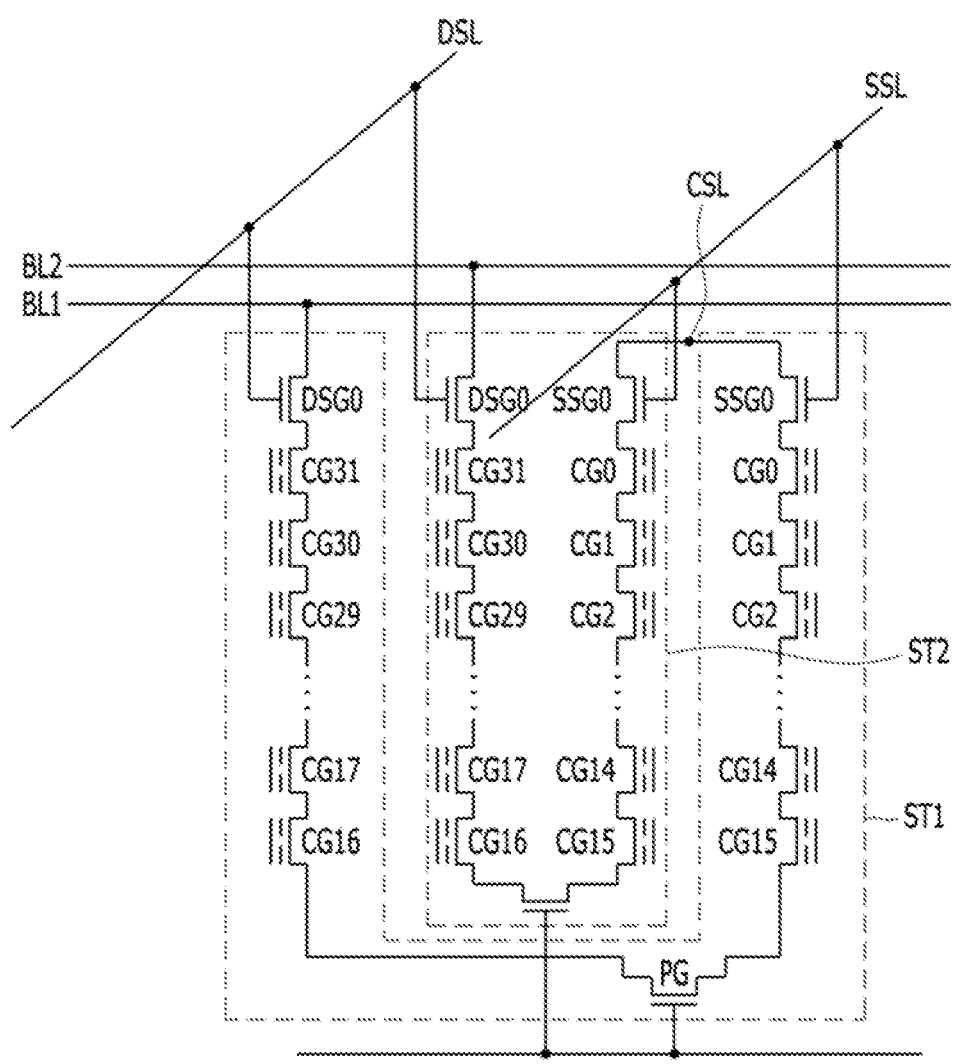

FIG. 18 is a circuit diagram illustrating the equivalent circuit of the memory block BLKj having the second structure as described above with reference to FIGS. 16 and 17. For the sake of convenience, only a first string and a second string, which form a pair in the memory block BLKj in the second structure are shown.

According to the embodiment of FIG. 18, in the memory block BLKj having the second structure among the plurality of blocks of the memory device 150, cell strings, each of which is implemented with one upper string and one lower string electrically coupled through the pipe gate PG as described above with reference to FIGS. 16 and 17, may be provided in such a way as to define a plurality of pairs.

Namely, in the certain memory block BLKj having the second structure, memory cells CG0 to CG31 stacked along a first channel CH1 (not shown), for example, at least one source select gate SSG1 and at least one drain select gate DSG1 may form a first string ST1, and memory cells CG0 to CG31 stacked along a second channel CH2 (not shown), for example, at least one source select gate SSG2 and at least one drain select gate DSG2 may form a second string ST2.

The first string ST1 and the second string ST2 may be electrically coupled to the same drain select line DSL and the same source select line SSL. The first string ST1 may be electrically coupled to a first bit line BL1, and the second string ST2 may be electrically coupled to a second bit line BL2.

While it is described in FIG. 18 that the first string ST1 and the second string ST2 are electrically coupled to the same drain select line DSL and the same source select line SSL, it may be envisaged that the first string ST1 and the second string ST2 may be electrically coupled to the same source select line SSL and the same bit line BL, the first string ST1 may be electrically coupled to a first drain select line DSL1 and the second string ST2 may be electrically coupled to a second drain select line DSL2. Further it may be envisaged that the first string ST1 and the second string ST2 may be electrically coupled to the same drain select line DSL and the same bit line BL, the first string ST1 may be electrically coupled to a first source select line SSL1 and the second string ST2 may be electrically coupled a second source select line SSL2.

Figure 19:
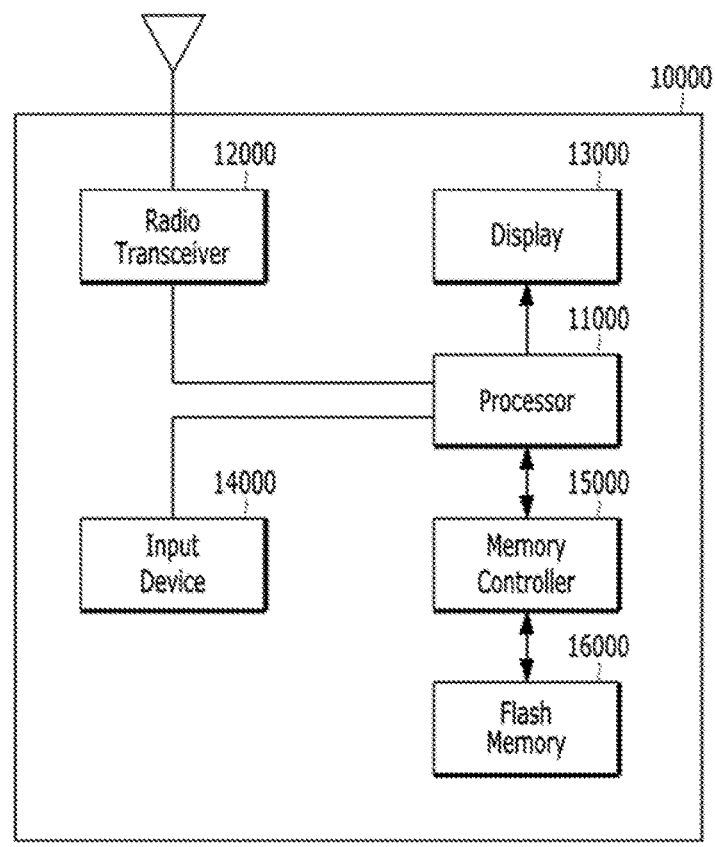
FIG. 19 is a block diagram illustrating an example of an electronic device including a semiconductor memory system, in accordance with an embodiment of the present invention.

FIG. 19 is a block diagram illustrating an electronic device 10000 including a memory controller 15000 and a flash memory 16000 according to an embodiment of the present invention.

According to the embodiment of FIG. 19, the electronic device 10000, which includes but is not limited to a cellular phone, a smart phone, or a tablet PC, may include the flash memory 16000 implemented by a flash memory device and the memory controller 15000 for controlling the flash memory 16000. The flash memory 16000 may correspond to the memory system 110 described above with reference to FIGS. 11 to 18. The flash memory 16000 may store random data. The memory controller 15000 may be controlled by a processor 11000 which controls overall operations of the electronic device 10000.

Data stored in the flash memory 16000 may be displayed through a display 13000 under the control of the memory controller 15000. The memory controller 15000 operates under the control of the processor 11000.

A radio transceiver 12000 may receive and output a radio signal through an antenna (ANT). For example, the radio transceiver 12000 may convert the radio signal received from the antenna into a signal which will be processed by the processor 11000. Thus, the processor 11000 may process the signal converted by the radio transceiver 12000, and may store the processed signal at the flash memory 16000. Otherwise, the processor 11000 may display the processed signal through the display 13000.

The radio transceiver 12000 may convert a signal from the processor 11000 into a radio signal, and may output the converted radio signal externally through the antenna.

An input device 14000 may receive a control signal for controlling an operation of the processor 11000 or data to be processed by the processor 11000, and may be implemented by a pointing device such as a touch pad, a computer mouse, a key pad, and a keyboard.

The processor 11000 may control the display 13000 such that data from the flash memory 16000, the radio signal from the radio transceiver 12000, or the data from the input device 14000 is displayed through the display 13000.

Figure 20:
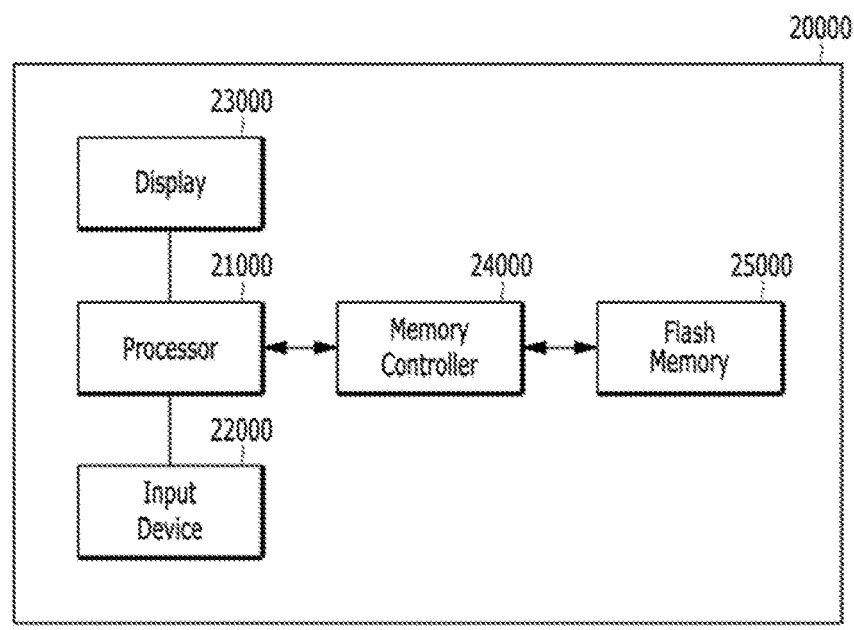
FIG. 20 is a block diagram illustrating another example of an electronic device including a semiconductor memory system, in accordance with an embodiment of the present invention.

FIG. 20 is a block diagram illustrating an electronic device 20000 including a memory controller 24000 and a flash memory 25000 according to an embodiment of the present invention.

According to the embodiment of FIG. 20, the electronic device 20000 may be implemented by a data processing device such as a personal computer (PC), a tablet computer, a net-book, an e-reader, a personal digital assistant (PDA), a portable multimedia player (PMP), an MP3 player, and an MP4 player, and may include the flash memory 25000, for example, the flash memory device, and the memory controller 24000 to control an operation of the flash memory 25000.

The electronic device 20000 may include a processor 21000 to control overall operations of the electronic device 20000. The memory controller 24000 may be controlled by the processor 21000.

The processor 21000 may display data stored in the semiconductor memory system through a display 23000 in response to an input signal from an input device 22000. For example, the input device 22000 may be implemented by a pointing device such as a touch pad, a computer mouse, a key pad, and a keyboard.

Figure 21:
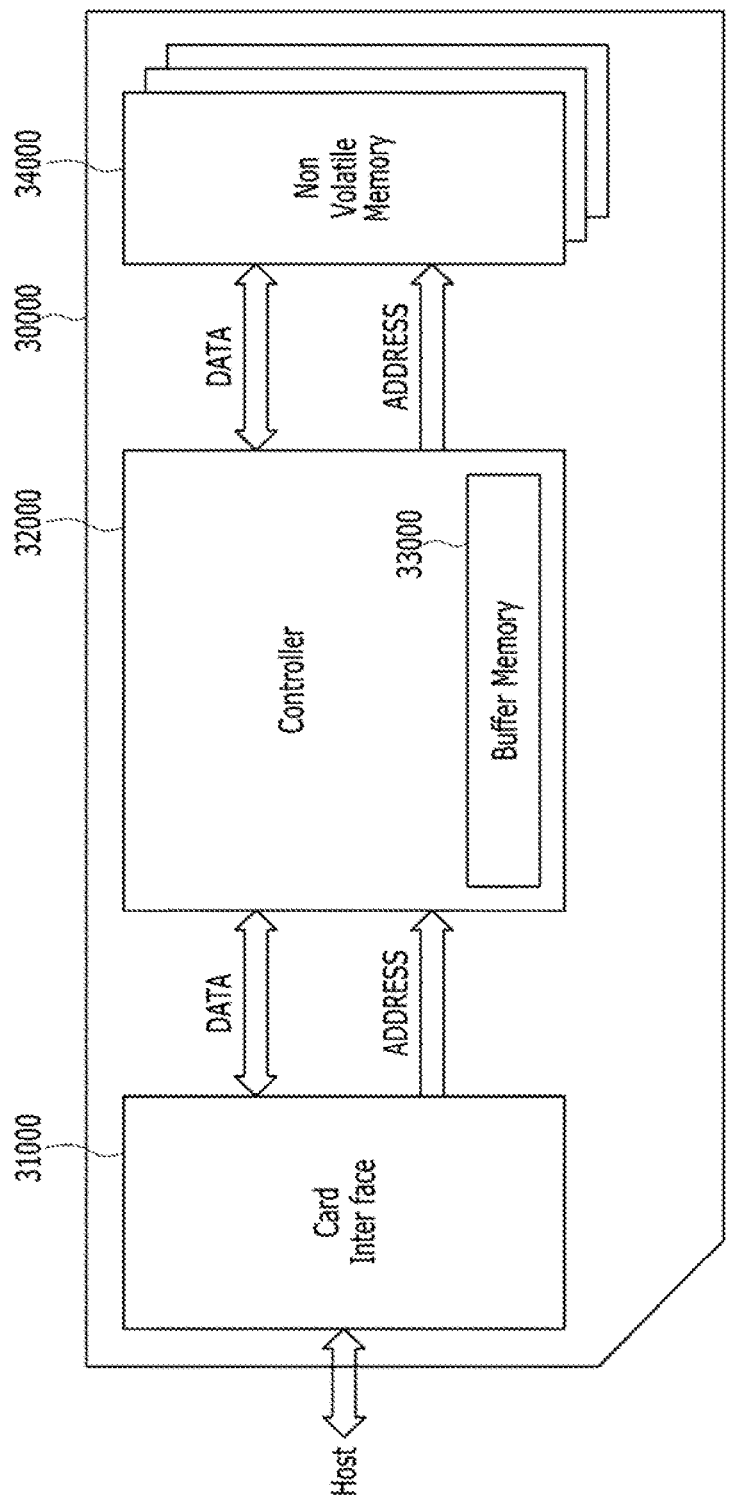
FIG. 21 is a block diagram illustrating yet another example of an electronic device including a semiconductor memory system, in accordance with an embodiment of the present invention.

FIG. 21 is a block diagram illustrating an electronic device 30000 including a controller 32000 and a non-volatile memory 34000 according to an embodiment of the present invention.

According to the embodiment of FIG. 21, the electronic device 30000 may include a card interface 31000, the controller 32000, and the non-volatile memory 34000, for example, a flash memory device.

The electronic device 30000 may exchange data with a host through the card interface 31000. The card interface 31000 may be a secure digital (SD) card interface or a multi-media card (MMC) interface, which does not limit the scope of the present invention. The card interface 31000 may interface the host and the controller 32000 according to a communication protocol of the host that is capable of communicating with the electronic device 30000.

The controller 32000 may control overall operations of the electronic device 30000, and may control data exchange between the card interface 31000 and the non-volatile memory 34000. A buffer memory 33000 of the controller 32000 may buffer data transferred between the card interface 31000 and the non-volatile memory 34000.

The controller 32000 may be coupled with the card interface 31000 and the non-volatile memory 34000 through a data bus DATA and an address bus ADDRESS. According to an embodiment, the controller 32000 may receive an address of data, which is to be read or written, from the card interface 31000 through the address bus ADDRESS, and may send it to the semiconductor memory system 34000. Further, the controller 32000 may receive or transfer data to be read or written through the data bus DATA connected with the card interface 31000 or the semiconductor memory system 34000.

When the electronic device 30000 is connected with the host such as a PC, a tablet PC, a digital camera, a digital audio player, a mobile phone, console video game hardware, and a digital set-top box, the host may exchange data with the non-volatile memory 34000 through the card interface 31000 and the controller 32000.

What is claimed is:

1. An operating method of a memory system comprising:
    reading a first data from a particular data group among a plurality of data groups included in a memory device;
    performing a first error correction code (ECC) decoding for the first data;
    when the first ECC decoding fails, reading one or more second data, which is the remaining data other than the first data, from the particular data group and performing a second ECC decoding for the second data;
    when the second ECC decoding fails, obtaining a third data through the second data, to which the second ECC decoding is successful;
    obtaining first and second soft read values respectively corresponding to the first data, to which the first ECC decoding fails, and the second data, to which the second ECC decoding fails;
    determining whether each of the plurality of bits included the first data includes an error bit by determining reliability of the bits of the first data based on the first soft read value;
    when the first data includes an error bit, determining whether the second data includes an error bit by determining reliability of the bits of the second data corresponding to a location of the error bit of the first data based on the second soft read value; and
    when the second data does not include an error bit, correcting the first data based on the second data, to which the second ECC decoding fails, and the third data,
    when the bit of the second data is the error bit, determining whether the bit of the first bit is the last bit;
    when the bit of the first bit is determined not to be the last bit, increasing index of bit of the first data and repeating the determining of the reliability of the bit of the first data through the first soft read value; and
    when the bit of the first bit is determined to be the last bit, performing a third ECC decoding for the first data.

2. The operating method of claim 1, wherein the plurality of data groups include data groups including:
    a plurality of data; and
    a spare data obtained through an XOR operation to the plurality of data.

3. The operating method of claim 1, further comprising:
    when the second ECC decoding is successful, correcting the error bit of the first data by performing a XOR operation for the second data.

4. The operating method of claim 1, the obtaining of the third data through the second data, to which the second ECC decoding is successful, when the second ECC decoding fails, includes:
    obtaining the third data by performing a XOR operation for the second data, to which the second ECC decoding is successful.

5. The operating method of claim 1, wherein the obtaining the first and second soft read values includes:
    obtaining first and second re-read data by reading again the first data through a first read voltage and a second read voltage different from the first read voltage; and
    obtaining the first soft read voltage corresponding to the first data by performing a XOR operation for the first and second re-read data and inverting one or more resultant bits of the XOR operation for the first and second re-read data.

6. The operating method of claim 1, wherein the obtaining the first and second soft read values includes:
    obtaining third and fourth re-read data by reading again the second data through a third read voltage and a fourth read voltage different from the third read voltage; and obtaining the second soft read voltage corresponding to the second data by performing a XOR operation for the third and fourth re-read data and inverting one or more resultant bits of the XOR operation for the third and fourth re-read data.

7. The operating method of claim 1, wherein the determining of whether each bit of the first data is an error bit by determining reliability of the bit of the first data through the first soft read value includes:
   determining the reliability of the bit of the first data through the first soft read value;
   when the bit of the first data is determined to be of low reliability, determining the bit of the first data to be the error bit; and
   when the bit of the first data is determined to be of high reliability, determining the bit of the first data not to be the error bit.

8. The operating method of claim 1, wherein the determining of the reliability of the bit of the second data through the second soft read value is not performed when the bit of the first data is determined not to be the error bit as a result of the determining of the reliability of the bit of the first data through the first soft read value.

9. The operating method of claim 1, wherein the determining of whether each bit of the second data is an error bit by determining reliability of the bit of the second data through the second soft read value includes:
   determining the reliability of the bit of the second data through the second soft read when the bit of the second data is determined to be of low reliability, determining the bit of the second data to be the error bit; and
   when the bit of the second data is determined to be of high reliability, determining the bit of the second data not to be the error bit.

10. The operating method of claim 1, wherein the correcting of the error bit of the first data includes:
    correcting the error bit of the first data by performing a XOR operation for the bits of the second data, to which the second ECC decoding fails, and the third data.

11. An operating method of a memory system comprising:
    reading a first data from a particular data group among a plurality of data groups included in a memory device;
    performing a first error correction code (ECC) decoding for the first data;
    when the first ECC decoding fails, reading a plurality of the remaining data other than the first data from the particular data group;
    performing a second ECC decoding for the plurality of the remaining data and determining whether the second ECC decoding is successful;
    when the second ECC decoding fails, obtaining a second data through the plurality of the remaining data, to which the second ECC decoding is successful;
    obtaining a plurality of soft read values respectively corresponding to bits of the first data, to which the first ECC decoding fails, and bits of the plurality of the remaining data, to which the second ECC decoding fails;
    obtaining a second soft read value through the other soft read values other than a first soft read value, which corresponds to the first data among the plurality of soft read values;
    obtaining a third data through the plurality of the remaining data, to which the second ECC decoding fails;
    determining whether each of the plurality of bits included in the first data includes an error bit by determining reliability of the bits of the first data based on the first soft read value;
    when one of the plurality of bits included in the first data includes an error bit, determining whether a bit of the third data corresponding to a location of the error bit of the first data includes an error bit by determining reliability of the third data based on the second soft read value; and
    when the third data does not include an error bit, correcting the first data based on the second data and the third data,
    when the bit of the third data is the error bit as a result of the determination of whether each bit of the third data is the error bit by determining the reliability of the bit of the third data, determining whether the bit of the first bit is the last bit;
        when the bit of the first bit is determined not to be the last bit, increasing index of bit of the first data and repeating the determining of the reliability of the bit of the first data through the first soft read value; and
        when the bit of the first bit is determined to be the last bit, performing a third ECC decoding for the first data.

12. The operating method of claim 11, wherein the plurality of data groups include a plurality of data groups including:
    a plurality of data; and
    a spare data obtained through an XOR operation to the plurality of data.

13. The operating method of claim 11, wherein the obtaining of the second data through the plurality of the remaining data, to which the second ECC decoding is successful, is performed by performing a XOR operation for a plurality of the remaining data, to which the second ECC decoding is successful among the plurality of the remaining data.

14. The operating method of claim 11, wherein the obtaining of the second soft read value through the other soft read values other than the first soft read value, which corresponds to the first data among the plurality of soft read values, is performed by performing an AND operation for the other soft read values other than the first soft read value, which corresponds to the first data among the plurality of soft read values.

15. The operating method of claim 11, wherein the determining of whether each bit of the first data is an error bit by determining reliability of the bit of the first data through the first soft read value includes:
    determining the reliability of the bit of the first data through the first, soft read value;
    when the bit of the first data is determined to be of low reliability, determining the bit of the first data to be the error bit; and
    when the bit of the first data is determined to be of high reliability, determining the bit of the first data not to be the error bit.

16. The operating method of claim 11, wherein the determining of the reliability of the bit of the second data through the second soft read value is not performed when the bit of the first data is determined not to be the error bit as a result of the determining of the reliability of the bit of the first data through the first soft read value.

17. The operating method of claim 11, wherein when the bit of the first data is the error bit, the determining of whether each bit of the third data is an error bit by determining reliability of the bit of the third data through the second soft read value includes:
  determining the reliability of the bit of the third data through the second soft read value;
  when the bit of the third data is determined to be of low reliability, determining the bit of the third data to be the error bit; and
  when the bit of the third data is determined to be of high reliability, determining the bit of the third data not to be the error bit.

18. The operating method of claim 11, wherein the correcting of the error bit of the first data includes:
  correcting the error bit of the first data by performing a XOR operation for the bits of the second data and the third data.

19. A memory system, comprising:
  a memory device that includes a plurality of memory dies each of which includes a plurality of planes, each of which includes a plurality of memory blocks that store data; and
  a controller including a ECC unit, and configured to:
    reading a first data from a particular data group among a plurality of data groups included in the memory device;
    performing a first error correction code (ECC) decoding for the first data;
    when the first ECC decoding fails, reading a plurality of the remaining data other than the first data from the particular data group;
    performing a second ECC decoding for the plurality of the remaining data;
    when the second ECC decoding fails, identifying data, to which the second ECC decoding fails, among the plurality of the remaining data;
    obtaining first and second soft read values respectively corresponding to each of the plurality of bits the first data, to which the first ECC decoding fails, and each of the plurality of bits the second data, to which the second ECC decoding fails;
    determining reliability of the each of the plurality of bits the first and second data based on the first and second soft read values; and
    correcting an error bit of the first data based on the reliability of the first and second data,
    wherein the correcting of the error bit of the first data includes:
      determining, at the controller, the reliability of the bit of the second data according to the determination result of the reliability of the bit of the first data through the first soft read value; and
    wherein the determining of the reliability of the bit of the second data through the first soft read value includes:
      when the bit of the first data is determined to be of high reliability, determining, at the controller, whether the bit of the first bit is the last bit without determining the reliability of the bit of the second data;
      when the bit of the first bit is determined not to be the last bit, increasing, at the controller, index of bit of the first data and repeating the determining of the reliability of the bit of the first data through the first soft read value; and
      when the bit of the first data is determined to be the last bit, performing, at the controller, a third ECC decoding for the first data, in which the error bit is corrected.

20. A memory system, comprising:
  a memory device that includes a plurality of memory dies each of which includes a plurality of planes, each of which includes a plurality of memory blocks that store data; and
  a controller including a ECC unit, and configured to:
  reading a first data from a particular data group among a plurality of data groups included in a memory device;
  performing a first error correction code (ECC) decoding for the first data;
  when the first ECC decoding fails, reading one or more second data, which is the remaining data other than the first data, from the particular data, group and performing a second ECC decoding for the second data;
  when the second ECC decoding fails, obtaining a third data through the second data, to which the second ECC decoding is successful;
  obtaining first and second soft read values respectively corresponding to each of the plurality of bits the first data, to which the first ECC decoding fails, and each of the plurality of bits the second data, to which the second ECC decoding fails;
  determining whether each of the plurality of bits the first data includes an error bit by determining reliability of the first data based on the first soft read value;
  when the first data includes an error bit, determining whether a bit of the second data corresponding to a location of the error bit of the first data includes an error bit by determining reliability of the bit of the second data corresponding to a location of the error bit of the first data based on the second soft read value; and
  when the second data does not include an error bit, correcting the first data based on the second data, to which the second ECC decoding fails, and the third data,
  when the bit of the second data is the error bit, determining whether the bit of the first bit is the last bit;
    when the bit of the first bit is determined not to be the last bit, increasing index of bit of the first data and repeating the determining of the reliability of the bit of the first data through the first soft read value; and
  when the bit of the first bit is determined to be the last bit, performing a third ECC decoding for the first data.

21. A memory system, comprising:
  a memory device that includes a plurality of memory dies each of which includes a plurality of planes, each of which includes a plurality of memory blocks that store data; and
  a controller including a ECC unit, and configured to:
  reading a first data from a particular data group among a plurality of data groups included in a memory device;
  performing a first error correction code (ECC) decoding for the first data;
  when the first ECC decoding fails, reading a plurality of the remaining data other than the first data from the particular data group;
  performing a second ECC decoding for the plurality of the remaining data and determining whether the second ECC decoding is successful;
  when the second BCC decoding fails, obtaining a second data through the plurality of the remaining data, to which the second ECC decoding is successful;
  obtaining a plurality of soft read, values respectively corresponding to the first data, to which the first ECC decoding fails, and the plurality of the remaining data, to which the second ECC decoding fails;

obtaining a second soft read value through the other soft read values other than a first soft read value, which corresponds to the first data among the plurality of soft read values;

obtaining a third data through the plurality of the remaining data, to which the second ECC decoding this;

determining whether each of the plurality of bits the first data includes an error bit by determining reliability of each of the plurality of bits the first data based on the first soft read value;

when the first data includes an error bit, determining whether a bit of the third data corresponding to a location of the error bit of the first data includes an error bit by determining reliability of the third data corresponding to a location of the error bit of the first data based on the second soft read value; and when the third data does not include an error bit, correcting the first data based on the second data and the third data, when the bit of the third data is the error bit as a result of the determination of whether each bit of the third data is the error bit by determining the reliability of the bit of the third data, determining whether the bit of the first bit is the last bit;

when the bit of the first bit is determined not to be the last bit, increasing index of bit of the first data and repeating the determining of the reliability of the bit of the first data through the first soft read value; and when the bit of the first bit is determined to be the last bit, performing a third ECC decoding for the first data.

* * * * *